United States Patent
Seo et al.

(10) Patent No.: US 11,538,868 B2
(45) Date of Patent: Dec. 27, 2022

(54) DISPLAY DEVICE

(71) Applicant: Samsung Display Co., Ltd., Yongin-si (KR)

(72) Inventors: Suyul Seo, Incheon (KR); Younggu Kang, Cheonan-si (KR); Hyun-Sung Park, Hwaseong-si (KR); Gunshik Kim, Yongin-si (KR); Dongjin Seo, Hwaseong-si (KR); Yu Deok Seo, Hwaseong-si (KR); Jongbeom Hong, Seongnam-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 236 days.

(21) Appl. No.: 17/084,080

(22) Filed: Oct. 29, 2020

(65) Prior Publication Data

US 2021/0217817 A1    Jul. 15, 2021

(30) Foreign Application Priority Data

Jan. 10, 2020    (KR) .......................... 10-2020-0003427

(51) Int. Cl.
*H01L 27/32*    (2006.01)
*G06F 3/044*    (2006.01)
(Continued)

(52) U.S. Cl.
CPC .......... *H01L 27/322* (2013.01); *G06F 3/0412* (2013.01); *G06F 3/0443* (2019.05);
(Continued)

(58) Field of Classification Search
CPC ... H01L 27/322; H01L 27/323; G06F 3/0412; G06F 3/0443
See application file for complete search history.

(56) References Cited

U.S. PATENT DOCUMENTS 9,046,952 B2    6/2015    Kim et al.
9,304,349 B2    4/2016    Wang
(Continued)

FOREIGN PATENT DOCUMENTS

KR    10-1850951 B1    4/2018

OTHER PUBLICATIONS

Junebeom HAN, et al., "Fabrication of flexible ultraviolet photodetectors using an all-spray-coating process", AIP Advances 6 (2016) 045218, 8 pages.
(Continued)

*Primary Examiner* — Victoria K. Hall
(74) *Attorney, Agent, or Firm* — Lewis Roca Rothgerber Christie LLP

(57) ABSTRACT

A display device includes a display panel including a plurality of pixels and an input sensing unit including a plurality of color filters that correspond with the pixels. The color filters include a plurality of conductive color filters that are electrically conductive, and the conductive color filters include first conductive color filters in first sensing areas arranged in a first direction and second conductive color filters in second sensing areas arranged in a second direction. The input sensing unit includes a first connection pattern electrically coupling the first conductive color filters and a second connection pattern electrically coupling the second conductive color filters.

19 Claims, 20 Drawing Sheets

(51) Int. Cl.
*G06F 3/041* (2006.01)
*H01L 51/52* (2006.01)
(52) U.S. Cl.
CPC ........ *H01L 27/323* (2013.01); *H01L 27/3216* (2013.01); *H01L 27/3218* (2013.01); *G06F 2203/04103* (2013.01); *H01L 51/5284* (2013.01)

(56) References Cited

U.S. PATENT DOCUMENTS

| | | | |
|---|---|---|---|
| 10,168,844 B2* | 1/2019 | Kwon | H01L 51/5284 |
| 10,665,661 B2* | 5/2020 | Park | H01L 51/5281 |
| 10,707,280 B2* | 7/2020 | Jeong | G06F 3/0418 |
| 2013/0162549 A1* | 6/2013 | Kim | G06F 3/0412 |
| | | | 977/734 |
| 2014/0368749 A1* | 12/2014 | Alonso | G02F 1/13338 |
| | | | 445/24 |

OTHER PUBLICATIONS

Sahin Coksun, et al., "Optimization of silver nanowire networks for polymer light emitting diode electrodes", Nanotechnology 24 (2013) 125202, 8 pages.

* cited by examiner

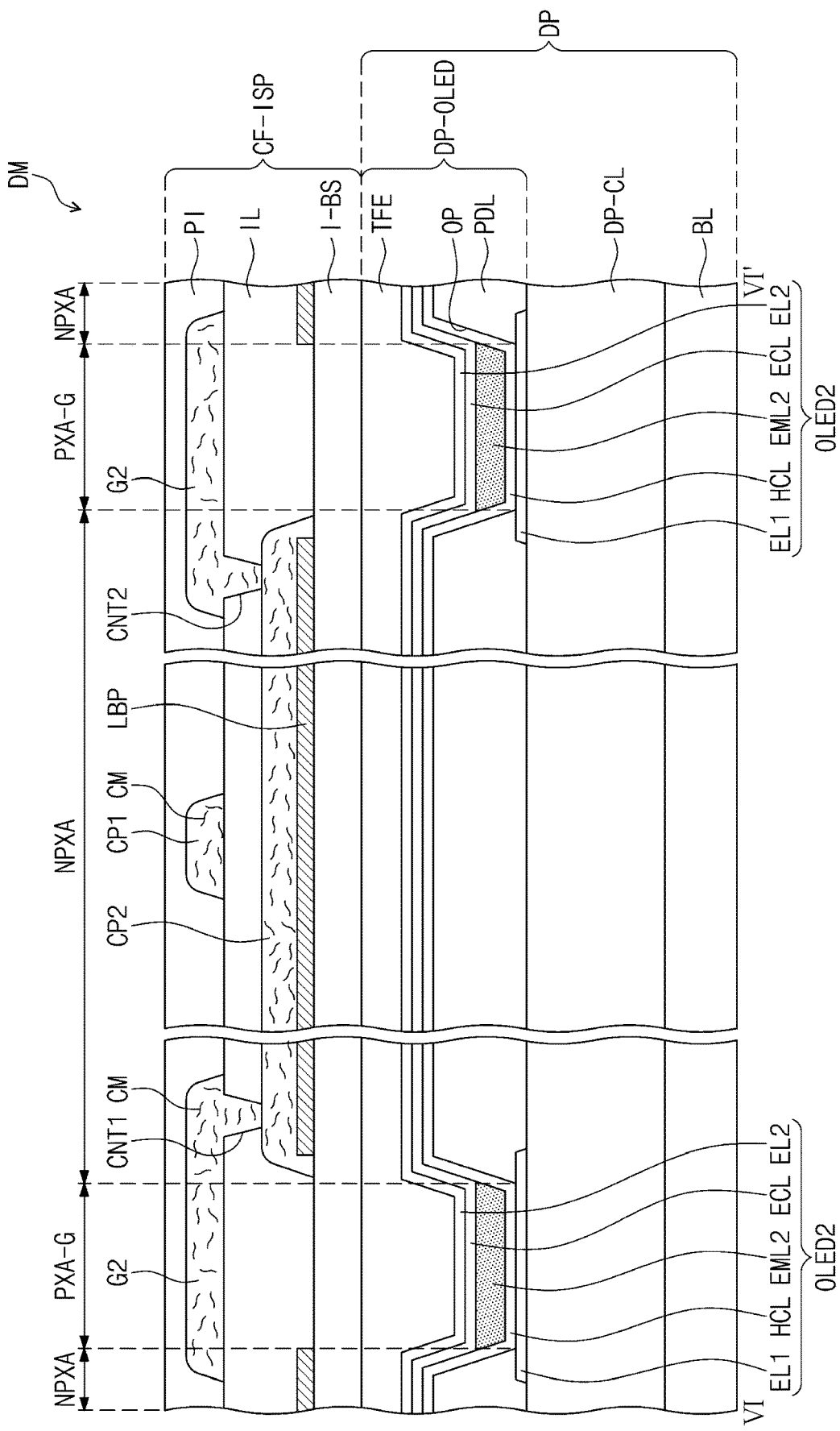

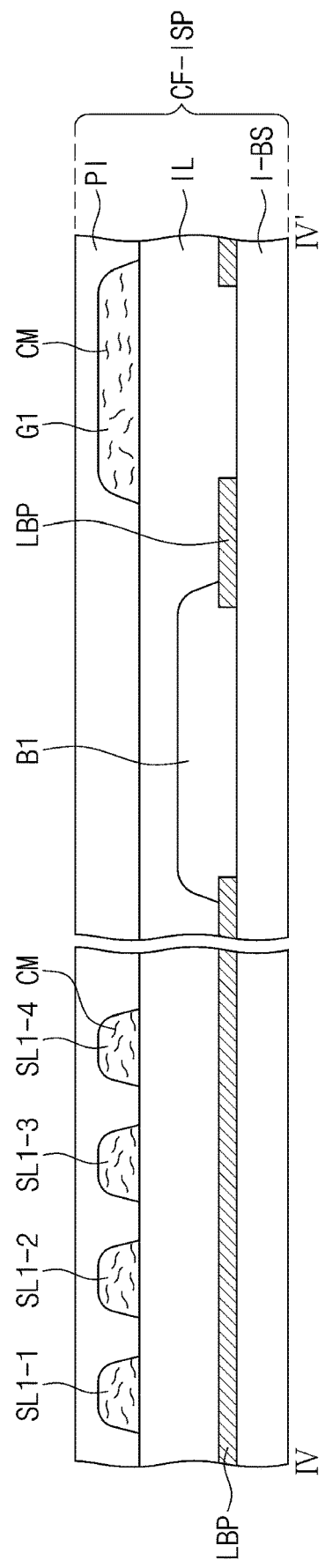

DISPLAY DEVICE

CROSS-REFERENCE TO RELATED APPLICATION

This application claims priority to and the benefit of Korean Patent Application No. 10-2020-0003427, filed on Jan. 10, 2020, the entire content of which is incorporated herein by reference.

BACKGROUND

1. Field

Embodiments of the present disclosure relate to a display device. For example, embodiments of the present disclosure relate to a display device including an input sensing unit having improved sensing sensitivity.

2. Description of the Related Art

Electronic devices, such as a smartphone, a tablet computer, a notebook computer, and a smart television, are substantially continuously being developed. The electronic devices include a display device to provide information. The electronic devices further include a variety of electronic modules in addition to the display device.

Display devices include an input sensing panel as their input device. The input sensing panel is on a display panel that displays an image.

SUMMARY

Embodiments of the present disclosure provide a display device capable of improving a sensing sensitivity of an input sensing unit and having reduced thickness.

Embodiments of the present disclosure provide a display device including a display panel including a plurality of pixels and an input sensing unit including a plurality of color filters to correspond to the plurality of pixels.

The plurality of color filters include a plurality of conductive color filters having a conductivity, and the plurality of conductive color filters include first conductive color filters in first sensing areas arranged in a first direction and second conductive color filters in second sensing areas arranged in a second direction.

The input sensing unit further includes a first connection pattern electrically coupling the first conductive color filters and a second connection pattern electrically coupling the second conductive color filters.

According to the above, as the display device includes the input sensing unit that has an anti-reflective function and senses the external input, the overall sensing sensitivity of the display device may be improved, and the overall thickness of the display device may be reduced. For example, a reliability of the display device that is foldable, slidable, and stretchable may be improved when the overall thickness is reduced.

In addition, because the conductive color filters are used as the sensing electrodes, the number of masks used to form the input sensing unit may be reduced, and as a result, a manufacturing process of the display device may be simplified.

BRIEF DESCRIPTION OF THE DRAWINGS

The above and other features of the present disclosure will become readily apparent by reference to the following detailed description when considered in conjunction with the accompanying drawings wherein:

FIG. 8B is a cross-sectional view showing a display module taken along a line VI-VI' shown in FIG. 7 according to an exemplary embodiment of the present disclosure;

FIG. 8C is a cross-sectional view showing an input sensing unit taken along a line IV-IV' shown in FIG. 4 according to an exemplary embodiment of the present disclosure;

DETAILED DESCRIPTION

Figure 1A:
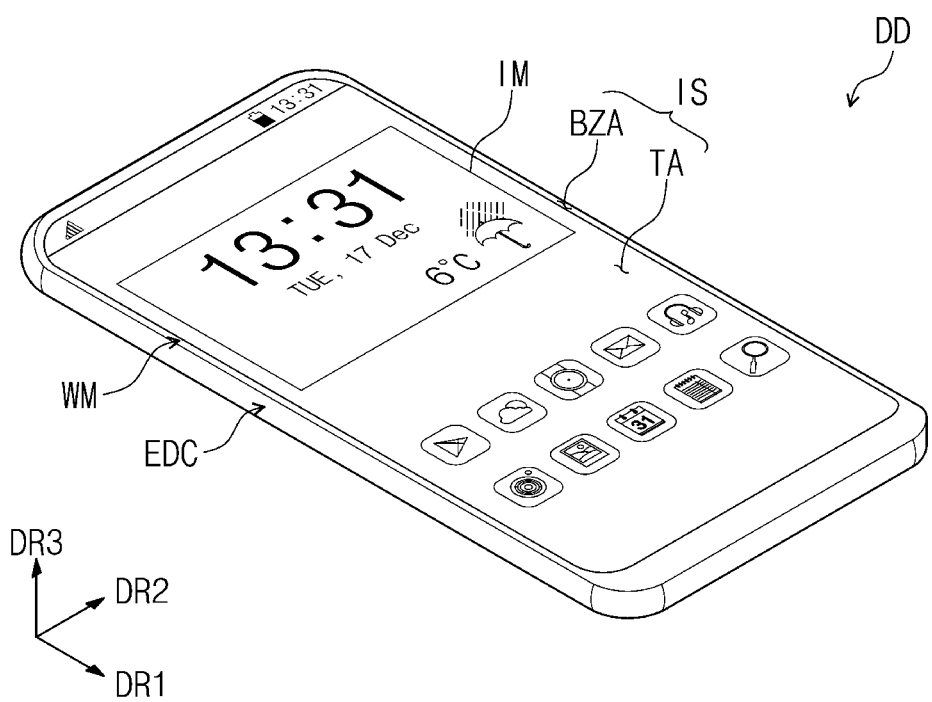
FIG. 1A is a perspective view showing a display device according to an exemplary embodiment of the present disclosure.

In the present disclosure, it will be understood that when an element or layer is referred to as being "on", "connected to" or "coupled to" another element or layer, it can be directly on, connected or coupled to the other element or layer or intervening elements or layers may be present.

Like numerals refer to like elements throughout. In the drawings, the thickness, ratio, and dimension of components may be exaggerated for effective description of the technical content.

As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer, or section from another region, layer or section. Thus, a first element, component, region, layer, or section discussed below could be termed a second element, component, region, layer or section without departing from the teachings of the present disclosure. As used herein, the singular forms, "a", "an" and "the" are intended to include the plural forms as well, unless the context clearly indicates otherwise.

Spatially relative terms, such as "beneath", "below", "lower", "above", "upper" and the like, may be used herein for ease of description to describe one element or feature's relationship to another element(s) or feature(s) as illustrated in the figures.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Hereinafter, embodiments of the present disclosure will be explained in more detail with reference to the accompanying drawings.

Figure 1B:
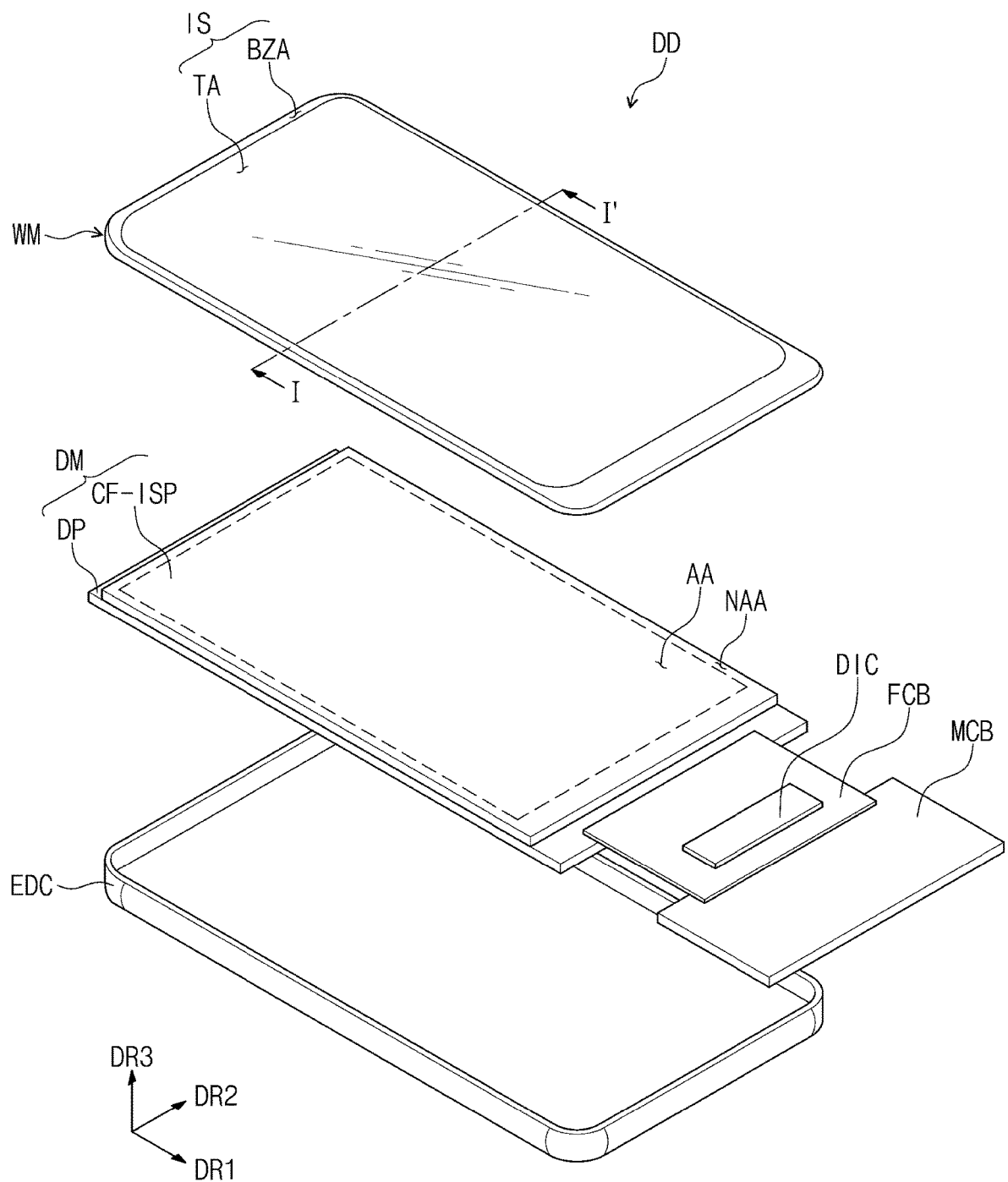
FIG. 1B is an exploded perspective view showing a display device according to an exemplary embodiment of the present disclosure.
Figure 2:
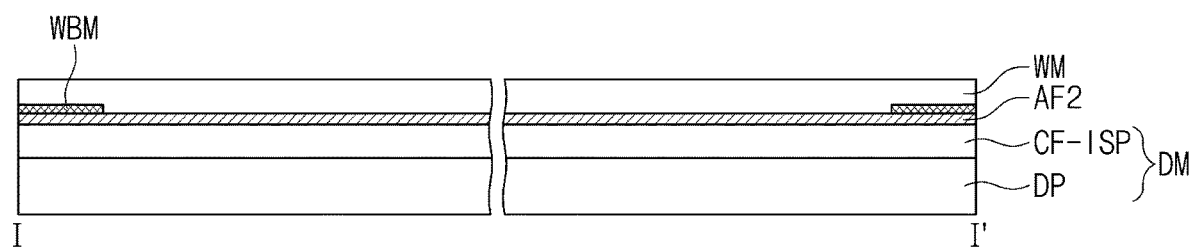
FIG. 2 is a cross-sectional view showing the display device taken along a line I-I' shown in FIG. 1B.

FIG. 1A is a perspective view showing a display device DD according to an exemplary embodiment of the present disclosure, and FIG. 1B is an exploded perspective view showing the display device DD according to an exemplary embodiment of the present disclosure. FIG. 2 is a cross-sectional view taken along a line I-I' shown in FIG. 1B.

Referring to FIGS. 1A, 1B, and 2, the display device DD may be activated in response to electrical signals. The display device DD may be applied to various suitable electronic devices. For example, the display device DD may be applied to electronic devices, such as a smart watch, a tablet computer, a notebook computer, a computer, and/or a smart television.

The display device DD may display an image IM toward a third direction DR3 through a display surface IS substantially parallel to each of a first direction DR1 and a second direction DR2. The display surface IS through which the image IM is displayed may correspond to a front surface of the display device DD. The image IM may include a still image as well as a motion image (e.g., a series of images).

In the present exemplary embodiment, front (or upper) and rear (or lower) surfaces of each member are defined with respect to a direction in which the image IM is displayed. The front and rear surfaces are opposite to each other in the third direction DR3, and a normal line direction of (e.g., a direction along a line normal to) each of the front and rear surfaces is substantially parallel to the third direction DR3.

A distance in the third direction DR3 between the front surface and the rear surface of the display device DD may correspond to a thickness in the third direction DR3 of the display device DD. In some embodiments, directions indicated by the first, second, and third directions DR1, DR2, and DR3 are relative to each other, and thus, the directions indicated by the first, second, and third directions DR1, DR2, and DR3 may be changed to other directions.

The display device DD may sense an external input applied thereto from the outside. The external input may include inputs of various suitable forms provided from the outside of the display device DD.

For example, the external input may include external inputs in proximity to or approaching close to the display device DD at a set or predetermined distance (e.g., a hovering input) as well as a touch input by a user's body, e.g., a hand and/or finger of a user. In addition, the external input may include various suitable forms, such as force, pressure, temperature, and/or light.

The front surface of the display device DD may be divided into a transmission area TA and a bezel area BZA. The image IM may be displayed through the transmission area TA. The user may view the image IM through the transmission area TA. In the present exemplary embodiment, the transmission area TA may have a quadrangular shape with rounded vertices. However, this is merely exemplary, and the transmission area TA may have a variety of other suitable shapes and should not be particularly limited.

The bezel area BZA may be defined to be adjacent to the transmission area TA. The bezel area BZA may have a set or predetermined color. The bezel area BZA may surround the transmission area TA. Accordingly, the shape of the transmission area TA may be defined by the bezel area BZA, however, this is merely exemplary. For example, the bezel area BZA may be adjacent to only one side of the transmission area TA or may be omitted. The display device DD according to the exemplary embodiment of the present disclosure may be implemented in various suitable forms, and, it should not be particularly limited.

As shown in FIGS. 1B and 2, the display device DD may include a window WM, a display module DM, and an external case EDC. The display module DM may include a display panel DP and an input sensing unit CF-ISP.

The window WM may include a transparent material through which an image transmits (e.g., the transparent material may be transparent or substantially transparent to visible light). For example, the window WM may include glass, sapphire, or plastic. The window WM is shown in a single layer, however, it should not be limited thereto or thereby. The window WM may include a plurality of layers. In some embodiments, the bezel area BZA of the display device DD may be obtained by printing a material having the set or predetermined color on an area of the window WM. As an example, the window WM may include a light blocking pattern WBM to define the bezel area BZA. The light blocking pattern WBM may be a colored (e.g., opaque) organic layer and may be formed by a coating method.

The display panel DP according to the exemplary embodiment of the present disclosure may be a light-emitting type of display panel, however, it should not be particularly limited. For instance, the display panel DP may be an organic light emitting display panel or a quantum dot light emitting display panel. A light emitting layer of the organic light emitting display panel may include an organic light emitting material. A light emitting layer of the quantum dot light emitting display panel may include a quantum dot and/or a quantum rod. Hereinafter, the organic light emitting display panel will be described as a representative example of the display panel DP.

Referring to FIG. 2, the input sensing unit CF-ISP may be directly on the display panel DP. According to the exemplary embodiment, the input sensing unit CF-ISP may be formed on the display panel DP through successive processes. In some embodiments, when the input sensing unit CF-ISP is directly on the display panel DP, an adhesive film may not be between the input sensing unit CF-ISP and the display panel DP, however, the present disclosure should not be limited thereto or thereby. For example, the adhesive film may be between the input sensing unit CF-ISP and the display panel DP. In this case, the input sensing unit CF-ISP is not manufactured through the successive processes with the display panel DP, and the input sensing unit CF-ISP may be fixed to an upper surface of the display panel DP by the adhesive film after being manufactured through a separate process.

The display panel DP may generate the image, and the input sensing unit CF-ISP may obtain coordinate information about the external input, e.g., a touch event.

The input sensing unit CF-ISP may include a base layer and a plurality of color filters on the base layer. The color filters may perform an anti-reflective function (e.g., the color filters may be anti-reflective layers) to minimize or reduce a reflection of a light provided from the outside of the display device DD. For example, the color filters may block or reduce a portion of the external light that enters and/or is reflected by the display device DD. The color filters may be on the display panel DP to reduce the reflection of the external light and minimize or reduce a luminance deterioration.

The color filters may include a plurality of conductive color filters having conductivity (e.g., the plurality of conductive color filters may be electrically conductive). The conductive color filters may perform an input sensing function that senses the external input. An arrangement of the conductive color filters will be described in more detail with reference to FIGS. 4 to 10B.

The display module DM may display the image in response to electrical signals and may transmit/receive information related to the external input. The display module DM may include an active area AA and a peripheral area NAA, which are defined therein. The active area AA may be defined as an area to provide the image provided from the display module DM.

The peripheral area NAA may be defined adjacent to the active area AA. For example, the peripheral area NAA may surround the active area AA. However, this is merely exemplary, and the peripheral area NAA may be defined in various suitable shapes and should not be particularly limited. According to the exemplary embodiment, the active area AA of the display module DM may correspond to at least a portion of the transmission area TA.

In the exemplary embodiment, the display module DM is coupled to the window WM through an adhesive film AF2. The adhesive film AF2 is disposed between the input sensing unit CF-ISP and the window WM.

The display module DM may further include a main circuit board MCB, a flexible circuit film FCB, and a driving chip DIC.

The main circuit board MCB may be coupled to the flexible circuit film FCB to be electrically coupled to the display panel DP. The main circuit board MCB may include a plurality of driving elements. The driving elements may include a circuit unit to drive the display panel DP.

The flexible circuit film FCB may be coupled to the display panel DP to electrically couple the display panel DP to the main circuit board MCB. The driving chip DIC may be mounted on the flexible circuit film FCB.

The driving chip DIC may include driving elements, for example, a data driving circuit, to drive a pixel of the display panel DP. According to the exemplary embodiment of the present disclosure, one flexible circuit film FCB is shown, however, the number of the flexible circuit films should not be limited to one. The flexible circuit film FCB may be provided in plural (e.g., as a plurality of flexible circuit films FCB) and may be coupled to the display panel DP.

FIG. 1B shows the driving chip DIC mounted on the flexible circuit film FCB, however, the present disclosure should not be limited thereto or thereby. For example, the driving chip DIC may be mounted directly on the display panel DP. In this case, a portion of the display panel DP, on which the driving chip DIC is mounted, may be bent and may be on the rear surface of the display module DM.

The input sensing unit CF-ISP may be electrically coupled to the main circuit board MCB via the flexible circuit film FCB, however, the exemplary embodiment of the present disclosure should not be limited thereto or thereby. For example, the display module DM may further include a separate flexible circuit film to electrically couple the input sensing unit CF-ISP to the main circuit board MCB.

The external case EDC may accommodate the display module DM. The external case EDC may be coupled to the window WM and may define an exterior of the display device DD. The external case EDC may absorb impacts applied thereto from the outside and may prevent or reduce entrance of foreign substance/moisture into the display module DM, thereby protecting components accommodated in the external case EDC. In some embodiments, as an example, the external case EDC may be provided in a form in which a plurality of accommodation members is combined.

The display device DD according to the exemplary embodiment may further include an electronic module that includes various suitable functional modules to operate the display module DM, a power supply module that supplies a power required for overall operation of the display device DD, and a bracket coupled to the display module DM and/or the external case EDC to divide an inner space of the display device DD.

Figure 3:
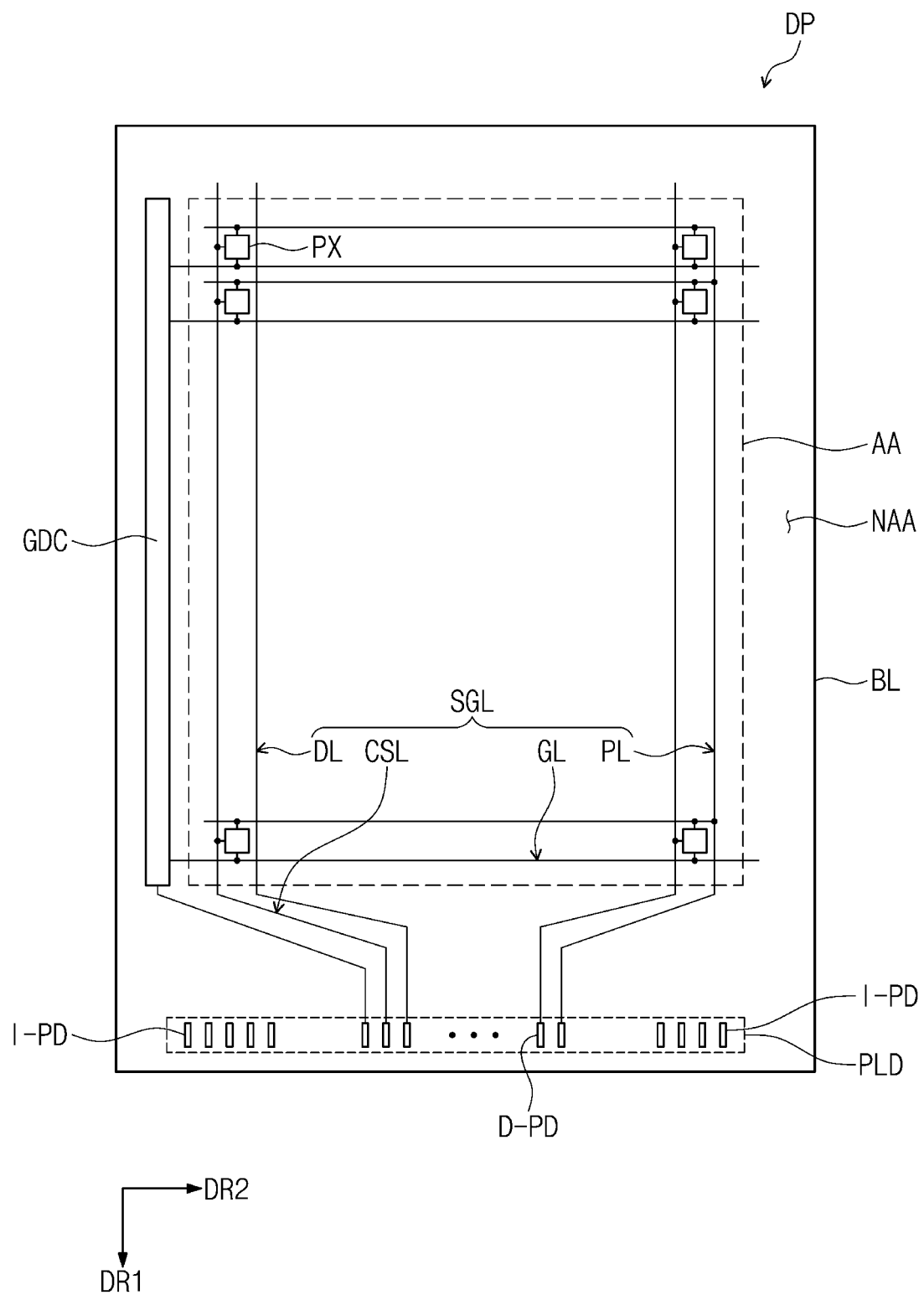
FIG. 3 is a plan view showing a display panel according to an exemplary embodiment of the present disclosure.
Figure 4:
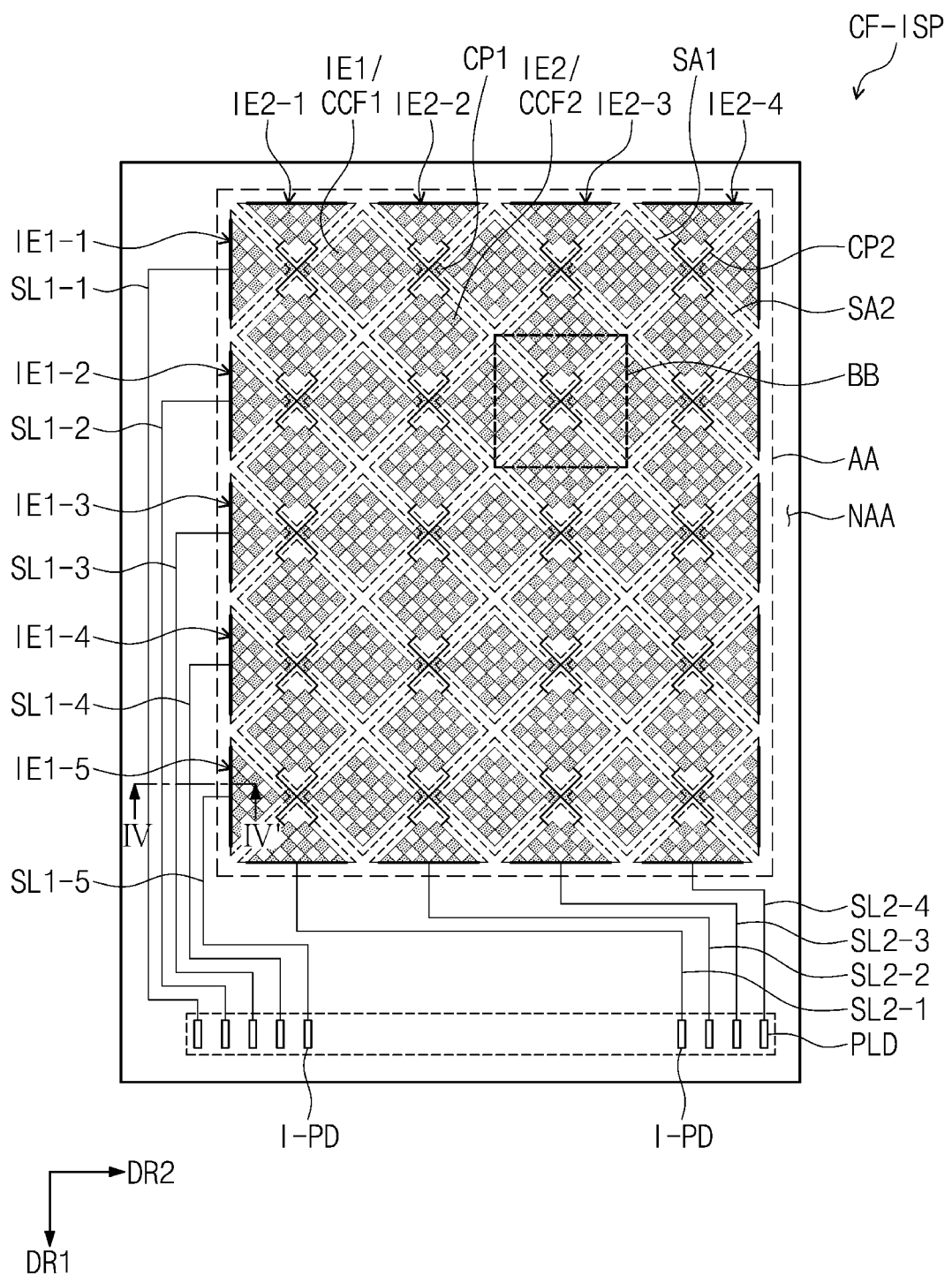
FIG. 4 is a plan view showing an input sensing unit according to an exemplary embodiment of the present disclosure.

FIG. 3 is a plan view showing the display panel DP according to an exemplary embodiment of the present disclosure, and FIG. 4 is a plan view showing the input sensing unit CF-ISP according to an exemplary embodiment of the present disclosure.

Referring to FIGS. 3 and 4, the display panel DP may include a driving circuit GDC, a plurality of signal lines SGL, and a plurality of pixels PX. The display panel DP may further include a pad part PLD in the peripheral area NAA. The pad part PLD may include pixel pads D-PD each being coupled to a corresponding signal line among the signal lines SGL.

The pixels PX may be in the active area AA. Each of the pixels PX may include organic light emitting diodes OLED1, OLED2, and OLED3 (refer to FIG. 6A) and a pixel driving circuit coupled to the organic light emitting diodes. The driving circuit GDC, the signal lines SGL, the pad part PLD, and the pixel driving circuit may be included in a circuit element layer DP-CL shown in FIG. 6A.

The driving circuit GDC may include a gate driving circuit. The gate driving circuit may generate a plurality of gate signals (hereinafter, referred to as "gate signals") and may sequentially output the gate signals to a plurality of gate lines GL (hereinafter, referred to as "gate lines") described below. The gate driving circuit may further output another control signal to the pixel driving circuit.

The signal lines SGL may include the gate lines GL, data lines DL, a power line PL, and a control signal line CSL. One gate line among the gate lines GL may be coupled to corresponding pixels among the pixels PX, and one data line among the data lines DL may be coupled to corresponding pixels among the pixels PX. The power line PL may be coupled to the pixels PX. The control signal line CSL may apply control signals to the driving circuit GDC. The signal lines SGL may overlap the active area AA and the peripheral area NAA.

The pad part PLD may be coupled to the flexible circuit film FCB (shown in FIG. 1B) and may include the pixel pads D-PD to couple the flexible circuit film FCB to the display panel DP and input pads I-PD to couple the flexible circuit film FCB to the input sensing unit CF-ISP. The pixel pads D-PD and the input pads I-PD may be provided by exposing some lines among lines in the circuit element layer DP-CL without (or substantially without) being covered by an insulating layer included in the circuit element layer DP-CL.

The pixel pads D-PD may be coupled to corresponding pixels PX through the signal lines SGL. In addition, one pixel pad among the pixel pads D-PD may be coupled to the driving circuit GDC.

Referring to FIG. 4, the input sensing unit CF-ISP according to an exemplary embodiment of the present disclosure may include the conductive color filters. As an example, the conductive color filters may include first conductive color filters CCF1 in first sensing areas SA1 and second conductive color filters CCF2 in second sensing areas SA2. The conductive color filters may be electrically conductive. For example, the first conductive color filters CCF1 and the second conductive color filters CCF2 may be electrically conductive.

The first sensing areas SA1 may be arranged in the first and second directions DR1 and DR2. The second sensing areas SA2 may be arranged in the first and second directions DR1 and DR2 and may be spaced apart from the first sensing areas SA1. The first and second sensing areas SA1 and SA2 may be defined in the active area AA.

The first conductive color filters CCF1 may be arranged in each of the first sensing areas SA1. The first conductive color filters CCF1 may be electrically coupled to each other in each of the first sensing areas SA1 to form a first sensing electrode IE1.

The first sensing electrode IE1 may be provided in plural (e.g., as a plurality of first sensing electrodes IE1), and the first sensing electrodes IE1 may be arranged in the first and second directions DR1 and DR2. In the present exemplary embodiment, the first sensing electrodes IE1 arranged in the second direction DR2 may be electrically coupled to each other by a first connection pattern CP1. The first sensing electrodes IE1 coupled to each other by the first connection pattern CP1 may form one sensing electrode row. As an example, the sensing electrode row may be provided in plural (e.g., as a plurality of sensing electrode rows IE1-1 to IE1-5), and the sensing electrode rows 1E1-1 to 1E1-5 may be arranged in the first direction DR1. The sensing electrode rows 1E1-1 to 1E1-5 may be respectively coupled to first signal lines SL1-1 to SL1-5. The first signal lines SL1-1 to SL1-5 may be arranged in the peripheral area NAA.

The second conductive color filters CCF2 may be arranged in each of the second sensing areas SA2. The second conductive color filters CCF2 may be electrically coupled to each other in each of the second sensing areas SA2 to form a second sensing electrode IE2.

The second sensing electrode IE2 may be provided in plural (e.g., as a plurality of the second sensing electrodes IE2), and the second sensing electrodes IE2 may be arranged in the first and second directions DR1 and DR2. In the present exemplary embodiment, the second sensing electrodes IE2 arranged in the first direction DR1 may be electrically coupled to each other by a second connection pattern CP2. The second sensing electrodes 1E2 coupled to each other by the second connection pattern CP2 may form one sensing electrode column. As an example, the sensing electrode column may be provided in plural (e.g., as a plurality of sensing electrode columns IE2-1 to IE2-4), and the sensing electrode columns may be arranged in the second direction DR2. The sensing electrode columns IE2-1 to IE2-4 may be respectively coupled to second signal lines SL2-1 to SL2-4. The second signal lines SL2-1 to SL2-4 may be arranged in the peripheral area NAA.

As an example, the input sensing unit CF-ISP may further include third signal lines coupled to the sensing electrode columns IE2-1 to IE2-4. In this case, the second signal lines SL2-1 to SL2-4 may be coupled to one ends of the sensing electrode columns IE2-1 to IE2-4, and the third signal lines may be coupled to the other ends of the sensing electrode columns IE2-1 to IE2-4.

The second sensing electrodes IE2 may be electrically insulated from the first sensing electrodes IE1. For example, the first and second sensing electrodes IE1 and IE2 may be electrically insulated from each other by the first and second connection patterns CP1 and CP2 on different layers from each other. Arrangements of the first and second connection patterns CP1 and CP2 will be described in more detail with reference to FIG. 5A to FIG. 11C.

FIG. 4 shows each of the first and second sensing areas SA1 and SA2 according to an exemplary embodiment, however, the shapes of the first and second sensing areas SA1 and SA2 should not be limited thereto or thereby. In an exemplary embodiment of the present disclosure, each of the first and second sensing areas SA1 and SA2 has a lozenge shape (e.g., a rhombus shape or diamond shape), however, it should not be limited to the lozenge shape. For example, each of the first and second sensing areas SA1 and SA2 may have a polygonal shape different from the lozenge shape.

The first signal lines SL1-1 to SL1-5 may be respectively coupled to one ends of the sensing electrode rows 1E1-1 to 1E1-5. In an exemplary embodiment of the present disclosure, the input sensing unit CF-ISP may further include signal lines coupled to the other end of the sensing electrode rows 1E1-1 to 1E1-5.

The input sensing unit CF-ISP may include the input pads I-PD extending from one ends of the first signal lines SL1-1 to SL1-5 and the second signal lines SL2-1 to SL2-4 and arranged in the peripheral area NAA.

Figure 5A:
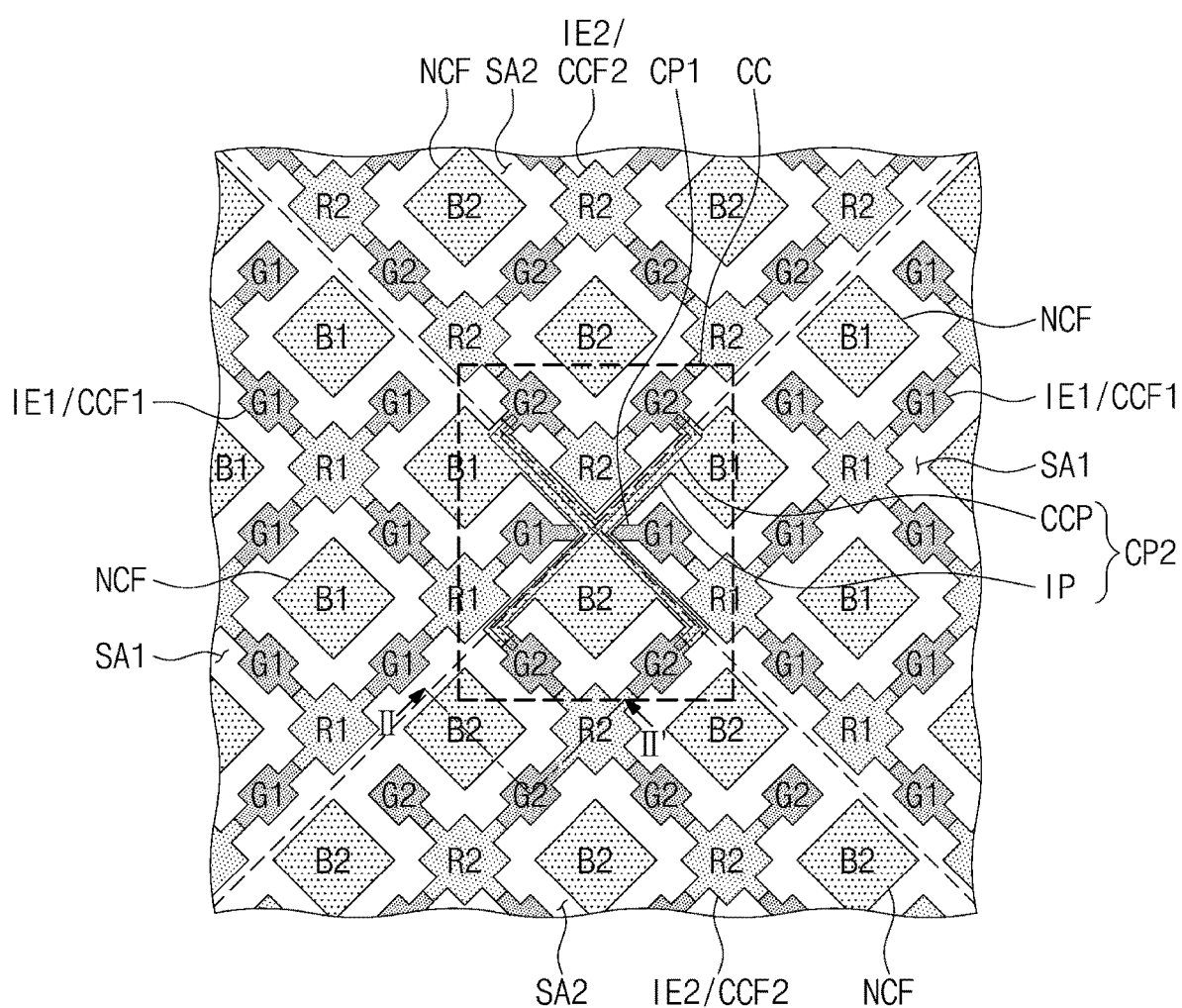
FIG. 5A is an enlarged plan view showing an input sensing unit corresponding to an area BB shown in FIG. 4 according to an exemplary embodiment of the present disclosure.
Figure 5B:
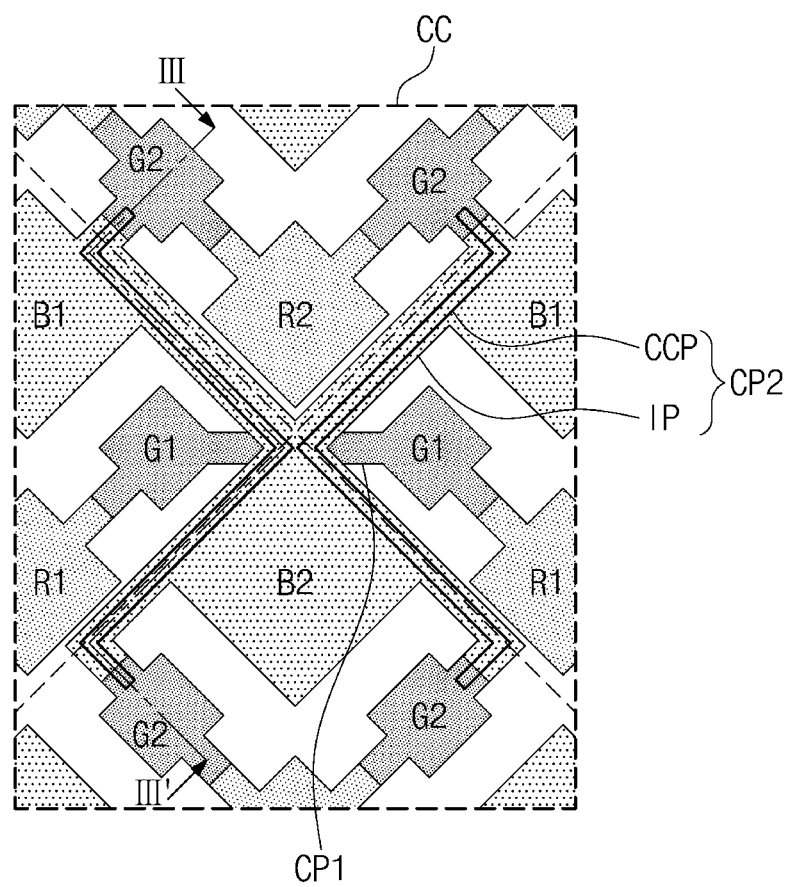
FIG. 5B is an enlarged plan view showing an area CC of FIG. 5A.
Figure 6A:
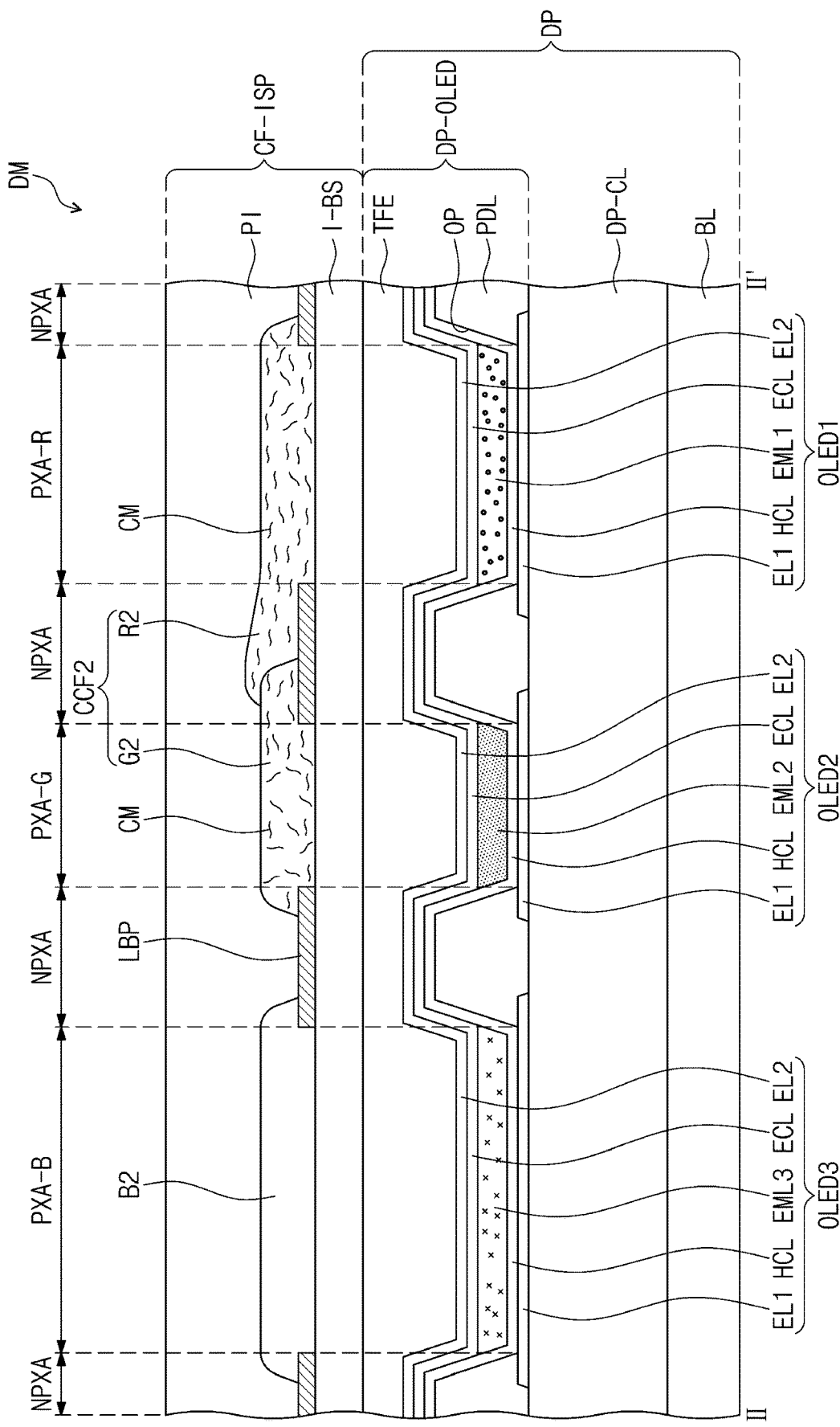
FIG. 6A is a cross-sectional view showing a display module taken along a line II-II' shown in FIG. 5A according to an exemplary embodiment of the present disclosure.
Figure 6B:
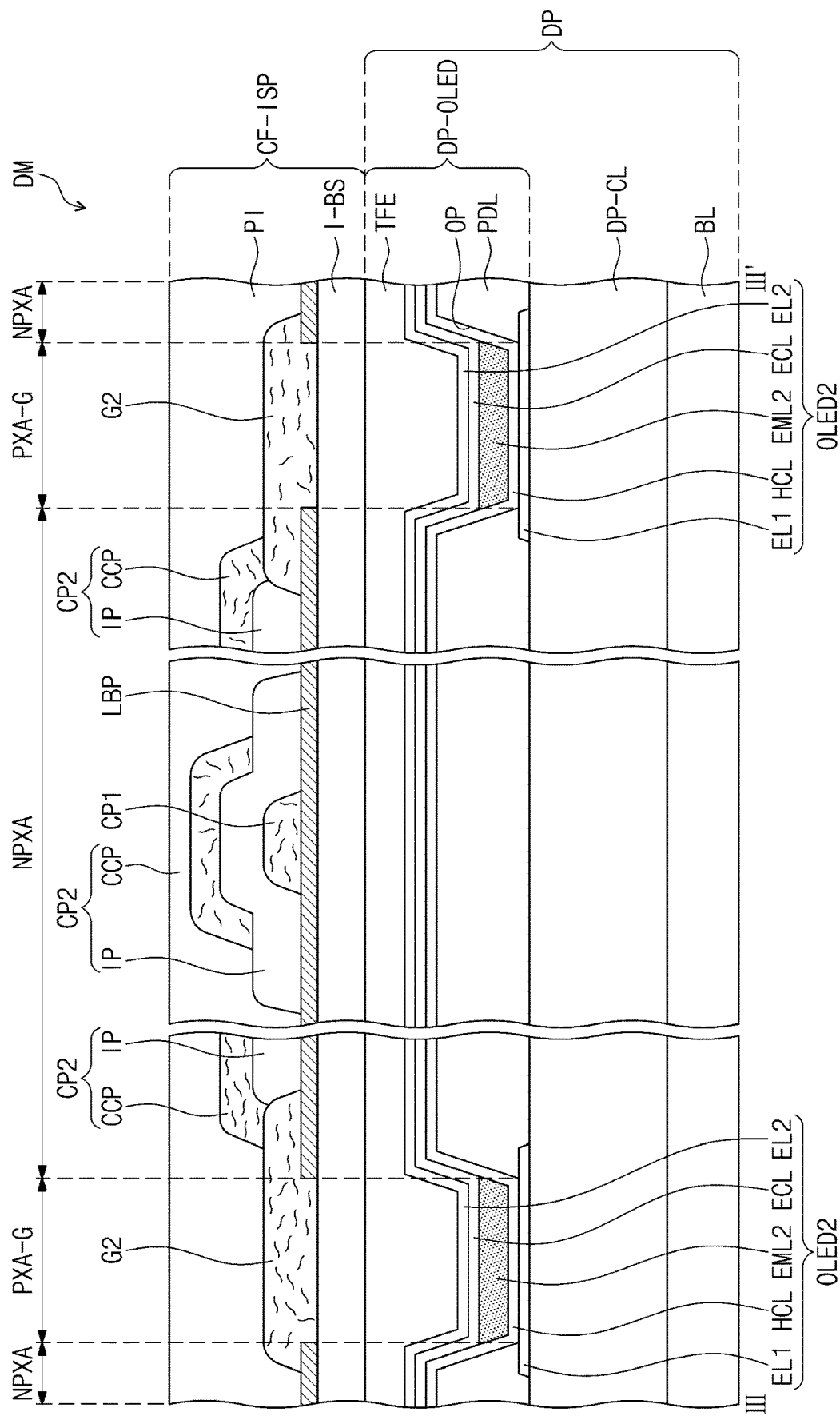
FIG. 6B is a cross-sectional view showing a display module taken along a line III-III' shown in FIG. 5B according to an exemplary embodiment of the present disclosure.
Figure 6C:
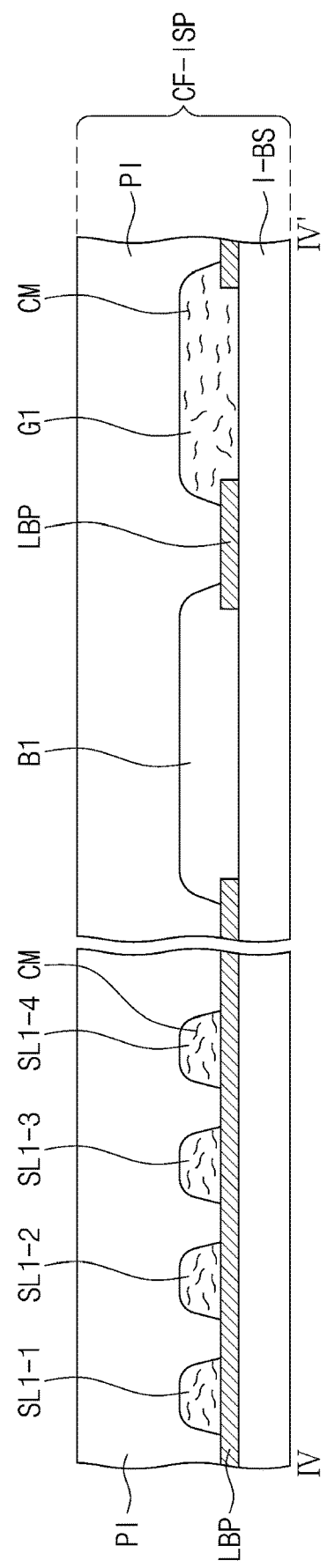
FIG. 6C is a cross-sectional view showing an input sensing unit taken along a line IV-IV' shown in FIG. 4 according to an exemplary embodiment of the present disclosure.

FIG. 5A is an enlarged plan view showing the input sensing unit corresponding to an area BB shown in FIG. 4 according to an exemplary embodiment of the present disclosure, and FIG. 5B is an enlarged plan view showing an area CC of FIG. 5A. FIG. 6A is a cross-sectional view showing the display module taken along a line II-II' shown in FIG. 5A according to an exemplary embodiment of the present disclosure, FIG. 6B is a cross-sectional view showing the display module taken along a line III-III' shown in FIG. 5B according to an exemplary embodiment of the present disclosure, and FIG. 6C is a cross-sectional view showing the input sensing unit taken along a line IV-IV' shown in FIG. 4 according to an exemplary embodiment of the present disclosure.

Referring to FIG. 5A, the first conductive color filter CCF1 of the input sensing unit CF-ISP may be in the first sensing area SA1, and the second conductive color filter CCF2 of the input sensing unit CF-ISP may be in the second sensing area SA2. The first conductive color filter CCF1 may include first green color filters G1 and first red color filters R1. The first green color filters G1 may be electrically coupled to the first red color filters R1 to form the first sensing electrode 1E1. The second conductive color filter CCF2 may include second green color filters G2 and second red color filters R2. The second green color filters G2 may be electrically coupled to the second red color filters R2 to form the second sensing electrode 1E2.

The first and second green color filters G1 and G2 and the first and second red color filters R1 and R2 may include a conductive material CM. The conductive material CM may include a carbon nanotube and/or a silver nanowire (AgNW). However, the conductive material CM according to the present disclosure should not be limited thereto or thereby and may include other conductive materials rather than or in addition to the above-described materials. The conductive material CM contained in the first and second green color filters G1 and G2 and the first and second red color filters R1 and R2 may have a density of about 0.02 mg/cm$^2$ to about 0.07 mg/cm$^2$.

When the conductive material CM has the density of about 0.02 mg/cm$^2$ to about 0.07 mg/cm$^2$, a surface resistance Rs of each of the first and second sensing electrodes may be reduced. In a case where the conductive material CM includes the silver nanowire having the surface resistance of about 0.125Ω to about 0.135Ω, the conductive material CM may have a transmittance of about 30% to about 40%.

The first and second red color filters R1 and R2 may correspond to a first light emitting area PXA-R (shown in FIG. 6A), and the first and second green color filters G1 and G2 may correspond to a second light emitting area PXA-G (shown in FIG. 6A).

The input sensing unit CF-ISP may further include a plurality of non-conductive color filters NCF having an insulating property. As an example, the non-conductive color filters NCF may include blue color filters B1 and B2. For the convenience of explanation, blue color filters arranged in the first sensing area SA1 are referred to as "first blue color filters B1", and blue color filters arranged in the second sensing area SA2 are referred to as "second blue color filters B2". The first and second blue color filters B1 and B2 do not include the conductive material CM and may have the insulating property. For example, the first and second blue color filters B1 and B2 may be electrically insulating. The first and second blue color filters B1 and B2 may correspond to a third light emitting area PXA-B (shown in FIG. 6A).

Referring to FIGS. 5A and 6A, the display panel DP may include a base layer BL, the circuit element layer DP-CL, a display element layer DP-OLED, and a thin film encapsulation layer TFE. The circuit element layer DP-CL, the display element layer DP-OLED, and the thin film encapsulation layer TFE may be on the base layer BL. In some embodiments, the display panel DP may further include functional layers, such as an anti-reflective layer, a refractive index control layer, and/or the like.

The base layer BL may include a synthetic resin layer. The synthetic resin layer is formed on a work substrate used when the display panel DP is manufactured. Then, a conductive layer and an insulating layer are formed on the synthetic resin layer. When the work substrate is removed, the synthetic resin layer corresponds to the base layer BL. The synthetic resin layer may include a polyimide-based resin layer, however, a material for the synthetic resin layer should not be particularly limited. In addition, the base layer BL may include a glass substrate, a metal substrate, and/or an organic/inorganic composite substrate.

The circuit element layer DP-CL may include at least one insulating layer and a circuit element. Hereinafter, the insulating layer included in the circuit element layer DP-CL is referred to as an "interlayer insulating layer". The interlayer insulating layer may include at least one intermediate inorganic layer and at least one intermediate organic layer. The circuit element may include a signal line and a pixel driving circuit. The circuit element layer DP-CL may be formed through a forming process of an insulating layer, a semiconductor layer, and a conductive layer using coating and depositing processes and a patterning process of the insulating layer, the semiconductor layer, and the conductive layer using a photolithography process.

The display element layer DP-OLED may include a pixel definition layer PDL and the organic light emitting diodes OLED1, OLED2, and OLED3. The pixel definition layer PDL may include an organic material. A first electrode EL1 may be on the circuit element layer DP-CL. The pixel definition layer PDL may be formed on the first electrode EL1. An pixel opening OP is defined through the pixel definition layer PDL. At least a portion of the first electrode EL1 may be exposed through the pixel opening OP of the pixel definition layer PDL. In an exemplary embodiment of the present disclosure, the pixel definition layer PDL may be omitted.

The light emitting areas PXA-G, PXA-R, and PXA-B and a non-light-emitting area NPXA defined adjacent to the light emitting areas PXA-G, PXA-R, and PXA-B may be defined in the display panel DP. The non-light-emitting area NPXA may surround the light emitting areas PXA-G, PXA-R, and PXA-B. In the present exemplary embodiment, the light emitting areas PXA-G, PXA-R, and PXA-B may be defined to correspond to some areas of the first electrode EL1 exposed through the pixel opening OP.

A hole control layer HCL may be commonly in the light emitting areas PXA-G, PXA-R, and PXA-B and the non-light-emitting area NPXA. Light emitting layers EML1, EML2, and EML3 that emit light may be on the hole control layer HCL. The light emitting layers EML1, EML2, and EML3 may be in an area corresponding to the pixel opening OP. For example, the light emitting layers EML1, EML2, and EML3 may be formed in the light emitting areas PXA-G, PXA-R, and PXA-B to be separated from each other. The light emitting layers EML1, EML2, and EML3 may include an organic material and/or an inorganic material. The light emitting layers EML1, EML2, and EML3 may generate set or predetermined colors of light. For example, the light emitting layers EML1, EML2, and EML3 may generate a red light, a green light, and a blue light, respectively. Accordingly, the light emitting areas PXA-G, PXA-R, and PXA-B may be defined as areas in which the light is generated, and the non-light-emitting area NPXA may be defined as an area in which the light is not generated.

In an exemplary embodiment, the light emitting layers EML1, EML2, and EML3 that are patterned are shown as a representative example, however, one light emitting layer may be entirely (or substantially entirely) over the light emitting areas PXA-G, PXA-R, and PXA-B. In this case, the light emitting layer may generate a white light. In addition, the light emitting layers EML1, EML2, and EML3 may have a multi-layer structure that is called a tandem.

An electron control layer ECL may be on the light emitting layers EML1, EML2, and EML3. In some embodiments, the electron control layer ECL may be commonly formed in the light emitting areas PXA-G, PXA-R, and PXA-B and the non-light-emitting area NPXA. A second electrode EL2 may be on the electron control layer ECL. The second electrode EL2 may be commonly formed in the light emitting areas PXA-G, PXA-R, and PXA-B and the non-light-emitting area NPXA.

The thin film encapsulation layer TFE may be on the second electrode EL2. The thin film encapsulation layer TFE may encapsulate the display element layer DP-OLED. The thin film encapsulation layer TFE may include at least one insulating layer. The thin film encapsulation layer TFE according to an exemplary embodiment of the present disclosure may include at least one inorganic layer (hereinafter, referred to as an "encapsulation inorganic layer"). The thin film encapsulation layer TFE according to an exemplary embodiment of the present disclosure may include at least one organic layer (hereinafter, referred to as an "encapsulation organic layer") and at least one encapsulation inorganic layer.

The encapsulation inorganic layer may protect the display element layer DP-OLED from moisture and oxygen, and the encapsulation organic layer may protect the display element layer DP-OLED from a foreign substance such as dust particles. The encapsulation inorganic layer may include a silicon nitride layer, a silicon oxynitride layer, a silicon oxide layer, a titanium oxide layer, and/or an aluminum oxide layer, however, it should not be particularly limited. The encapsulation organic layer may include an acrylic-based organic layer, however, it should not be particularly limited.

In FIGS. 5A and 6A, the light emitting areas PXA-G, PXA-R, and PXA-B may have different sizes from each other. For example, the size of the second light emitting area PXA-G may be smaller than the size of the first and third light emitting areas PXA-R and PXA-B, and the size of the first light emitting area PXA-R may be smaller than the size of the third light emitting area PXA-B, however, they should not be limited thereto or thereby. For instance, according to another exemplary embodiment of the present disclosure, the first, second, and third light emitting areas PXA-R, PXA-G, and PXA-B may have the same (e.g., substantially the same) size as each other.

The input sensing unit CF-ISP may be directly on the display panel DP. The input sensing unit CF-ISP may be directly on the thin film encapsulation layer TFE of the display panel DP. The input sensing unit CF-ISP may include the base layer I-BS, a light blocking pattern LBP, and the color filters G1, G2, R1, R2, B1, and B2, and the light blocking pattern LBP and the color filters G1, G2, R1, R2, B1, and B2 may be on the base layer I-BS. The base layer I-BS may be on the thin film encapsulation layer TFE and may include an inorganic material. For instance, the base layer I-BS may include a silicon nitride layer. The inorganic layer at an uppermost position of the thin film encapsulation layer TFE may also include the silicon nitride layer, and the silicon nitride layer of the thin film encapsulation layer TFE and the base layer I-BS may be formed under different conditions.

The color filters G1, G2, R1, R2, B1, and B2 may be on the base layer I-BS. As an example, FIG. 6A shows the second green color filter G2, the second red color filter R2, and the second blue color filter B2 among the color filters G1, G2, R1, R2, B1, and B2. The second green color filter G2, the second red color filter R2, and the second blue color filter B2 may correspond to the light emitting areas PXA-G, PXA-R, and PXA-B, respectively.

The second green, red, and blue color filters G2, R2, and B2 may be spaced apart from each other when viewed in a plane (e.g., in a plan view). In the present disclosure, the second green and red color filters G2 and R2 may be electrically coupled to each other to form the second sensing electrode 1E2. As an example, the second green and red color filters G2 and R2 may be directly in contact with each other in the non-light-emitting area NPXA and may overlap each other.

In the present exemplary embodiment, the second green color filter G2 transmits the green light, the second red color filter R2 transmits the red light, and the second blue color filter B2 transmits the blue light. Each of the second green, red, and blue color filters G2, R2, and B2 may include a polymer photosensitive resin and/or a pigment and/or a dye. The second green color filter G2 may include a green pigment and/or dye, the second red color filter R2 may include a red pigment and/or dye, and the second blue color filter B2 may include a blue pigment and/or dye.

In the present exemplary embodiment, the second green and red color filters G2 and R2 may include the conductive material CM. The conductive material CM may include the carbon nanotube and/or the silver nanowire (AgNW). However, the conductive material CM according to the present disclosure should not be limited thereto or thereby and may include another conductive material rather than or in addition to the above-mentioned conductive material. The second blue color filter B2 may not include the conductive material CM, and thus, may have the insulating property. For example the second blue filter B2 may be electrically insulating.

The first green, red, and blue color filters G1, R1, and B1 may be spaced apart from each other when viewed in a plane (e.g., in a plan view). In embodiments of the present disclosure, the first green and red color filters G1 and R1 may be electrically coupled to each other to form the first sensing electrode 1E1. As an example, the first green and red color filters G1 and R1 may be directly in contact with each other in the non-light-emitting area NPXA and may overlap each other.

In the present exemplary embodiment, the light blocking pattern LBP may be on the base layer I-BS. The light blocking pattern LBP may overlap the pixel definition layer PDL. The light blocking pattern LBP may not overlap the pixel opening OP defined through the pixel definition layer PDL. Therefore, the light blocking pattern LBP may not overlap the light emitting areas PXA-G, PXA-R, and PXA-B. When viewed in the plane (e.g., in a plan view), the area in which the light blocking pattern LBP is located may be defined as the non-light-emitting area NPXA.

The light blocking pattern LBP may be a pattern having a black color, e.g., a black matrix. For example, the light blocking pattern LBP may include a black coloring agent. The black coloring agent may include a black dye and/or a black pigment. The black coloring agent may include a metal material, carbon black, chromium, and/or oxide thereof.

The light blocking pattern LBP may partially overlap the second green, red, and blue color filters G2, R2, and B2 in the non-light-emitting area NPXA. For example, the light blocking pattern LBP may be partially covered by the second green, red, and blue color filters G2, R2, and B2 extending in the non-light-emitting area NPXA.

The input sensing unit CF-ISP may further include a protective layer PI that covers the color filters G2, R2, and B2 and the light blocking pattern LBP. The protective layer PI may be a planarization layer. For example, the protective layer PI may reduce a step difference between the color filters G2, R2, and B2 and the light blocking pattern LBP to planarize an upper surface of the input sensing unit CF-ISP.

The protective layer PI may be formed of a transparent polymer resin. The protective layer PI may further include a functional material in addition to the polymer resin. For example, the protective layer PI may further include a light absorbing agent, an antioxidant, and/or a scattering agent.

Referring to FIGS. 5B and 6B, at least one first green color filter G1 of the first sensing electrode IE1 may be electrically coupled to at least one first green color filter G1 of an adjacent first sensing electrode IE1 by the first connection pattern CP1. The first connection pattern CP1 may include the same (e.g., substantially the same) material as the first green color filter G1 and may be concurrently (e.g., substantially simultaneously) formed with the first green color filter G1 on the base layer I-BS.

As an example, a structure in which the first connection pattern CP1 is integrally formed with the first green color filter G1 is shown, however, the present disclosure should not be limited thereto or thereby. For example, the first connection pattern CP1 may include the same (e.g., substantially the same) material as the first red color filter R1 and may be integrally formed with the first red color filter R1.

The first connection pattern CP1 may couple two first green color filters G1 in the non-light-emitting area NPXA. For example, the first connection pattern CP1 may be on the light blocking pattern LBP in the non-light-emitting area NPXA.

At least one second green color filter G2 of the second sensing electrode IE2 may be electrically coupled to at least one second green color filter G2 of an adjacent second sensing electrode IE2 by the second connection pattern CP2. FIG. 5B shows a structure in which two second sensing electrodes IE2 adjacent to each other are coupled to each other by two second connection patterns CP2, however, the present disclosure should not be limited thereto or thereby. For example, the second sensing electrodes IE2 may be coupled to each other by one second connection pattern CP2. The second connection patterns CP2 may have substantially the same (e.g., substantially the same) structure in the structure in which the two second connection patterns CP2 are used.

The second connection pattern CP2 may include an insulating pattern IP and a conductive pattern CCP. As an example, the insulating pattern IP may be formed of the same (e.g., substantially the same) material as the non-conductive color filters, and the conductive pattern CCP may be formed of the same (e.g., substantially the same) material as the conductive color filters. As an example, in the case where the first connection pattern CP1 is formed of the same (e.g., substantially the same) material as the first and second green color filters G1 and G2, the conductive pattern CCP may be formed of the same (e.g., substantially the same) material as the first and second red color filters R1 and R2. In addition, the insulating pattern IP may be formed of the same (e.g., substantially the same) material as the first and second blue color filters B1 and B2.

However, as another example, in the case where the first connection pattern CP1 is formed of the same (e.g., substantially the same) material as the first and second red color filters R1 and R2, the conductive pattern CCP may be formed of the same (e.g., substantially the same) material as the first and second green color filters G1 and G2.

The insulating pattern IP may electrically insulate the first connection pattern CP1 from the conductive pattern CCP. Accordingly, the first connection pattern CP1 may be covered by the insulating pattern IP. FIG. 5B shows the structure in which the insulating pattern IP is integrally formed with the first and second blue color filters B1 and B2, however, the present disclosure should not be limited thereto or thereby. For example, the insulating pattern IP may be formed of the same (e.g., substantially the same) material as the first and second blue color filters B1 and B2 but may be spaced apart from each other. In addition, the insulating pattern IP may include a different insulating material from the first and second blue color filters B1 and B2.

The conductive pattern CCP may be on the insulating pattern IP and may have a width smaller than a width of the insulating pattern IP. In addition, both ends of the conductive pattern CCP may be respectively coupled to the second green color filters G2. The both ends of the conductive pattern CCP may respectively overlap the second green color filters G2, however, the present disclosure should not be limited thereto or thereby. For example, the both ends of the conductive pattern CCP may make contact directly (e.g., direct, physical contact) with the second red color filters R2.

The second connection pattern CP2 may be on the light blocking pattern LBP in the non-light-emitting area NPXA. As described above, as the first and second connection patterns CP1 and CP2 are in the non-light-emitting area NPXA, a deterioration in aperture ratio of the display module DM, which is caused by the first and second connection patterns CP1 and CP2, may be prevented or reduced.

Referring to FIGS. 4, 5A, and 6C, the first signal lines SL1-1 to SL1-5 may include the same (e.g., substantially the same) material as the first green color filters G1, and the second signal lines SL2-1 to SL2-4 may include the same (e.g., substantially the same) material as the second green color filters G2. Because the first and second green color filters G1 and G2 include the same (e.g., substantially the same) material as each other, the first signal lines SL1-1 to SL1-5 and the second signal lines SL2-1 to SL2-4 may include the same (e.g., substantially the same) material as each other, however, the present disclosure should not be limited thereto or thereby. For example, the first signal lines SL1-1 to SL1-5 and the second signal lines SL2-1 to SL2-4 may include different materials from each other. For example, the first signal lines SL1-1 to SL1-5 may include the same (e.g., substantially the same) material as the first green color filters G1, and the second signal lines SL2-1 to SL2-4 may include the same (e.g., substantially the same) material as the second red color filters R2. In some embodiments, the first signal lines SL1-1 to SL1-5 may include the same (e.g., substantially the same) material as the first red color filters R1, and the second signal lines SL2-1 to SL2-4 may include the same (e.g., substantially the same) material as the second green color filters G2.

As described above, when the first and second sensing electrodes IE1 and IE2 are formed by the conductive color filters CCF1 and CCF2, an overall thickness of the display module DM may be reduced. The reduction in overall thickness of the display module DM may be effective to improve product reliability of the flexible display device, e.g., a foldable display device, a slidable display device, and a stretchable display device.

In addition, because the first and second sensing electrodes IE1 and IE2 are formed in the light emitting areas PXA-R and PXA G, the area in which the first and second sensing electrodes IE1 and IE2 are formed may increase, and as a result, the sensing sensitivity of input sensing unit CF-ISP may be improved when sensing the external input.

Further, as the conductive color filters CCF1 and CCF2 are used as the first and second sensing electrodes IE1 and IE2, the number of masks used to form the input sensing unit CF-ISP may be reduced. As a result, a manufacturing process of the display module DM may be simplified.

Figure 7:
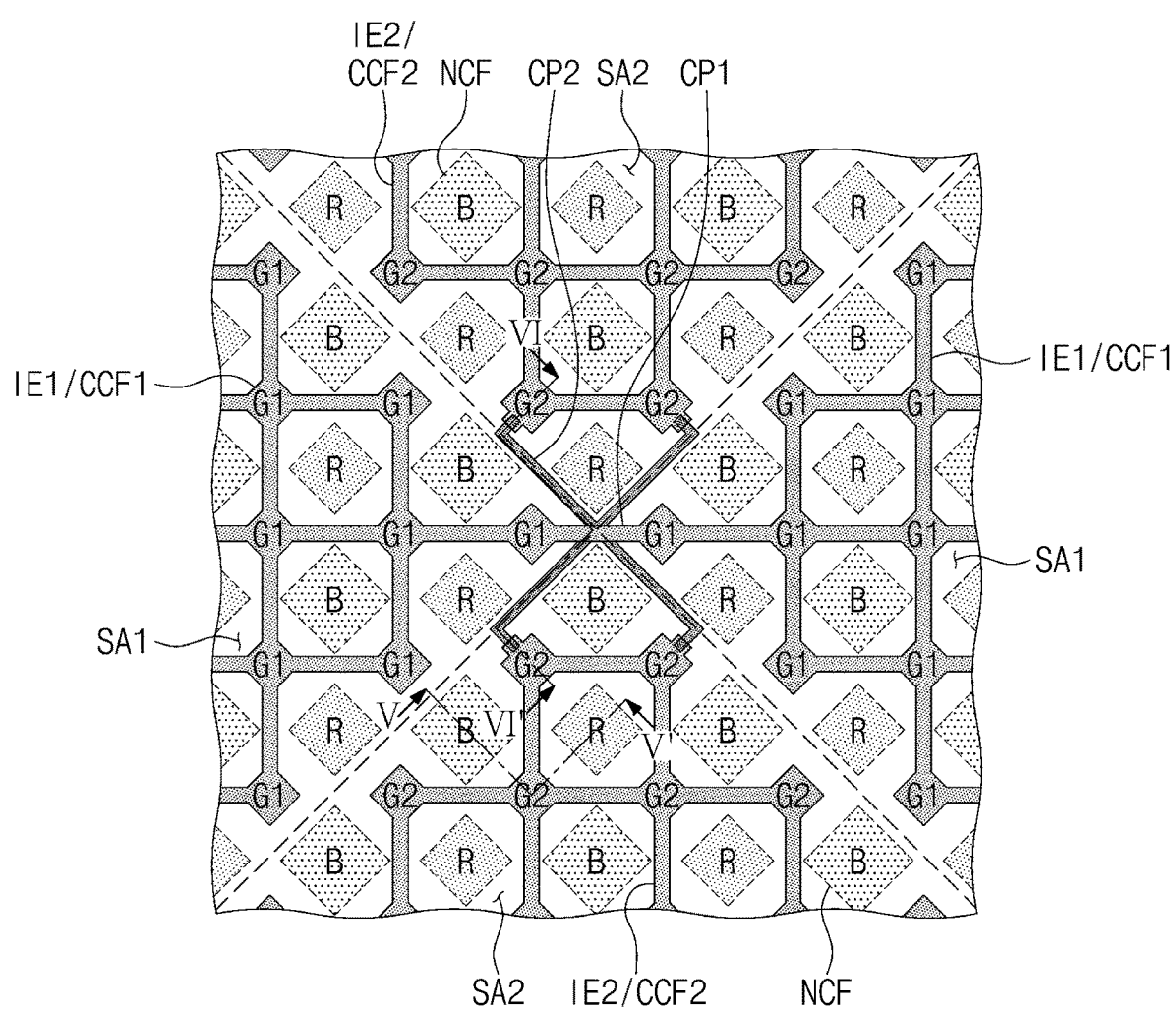
FIG. 7 is an enlarged plan view showing an input sensing unit corresponding to an area BB shown in FIG. 4 according to an exemplary embodiment of the present disclosure.
Figure 8A:
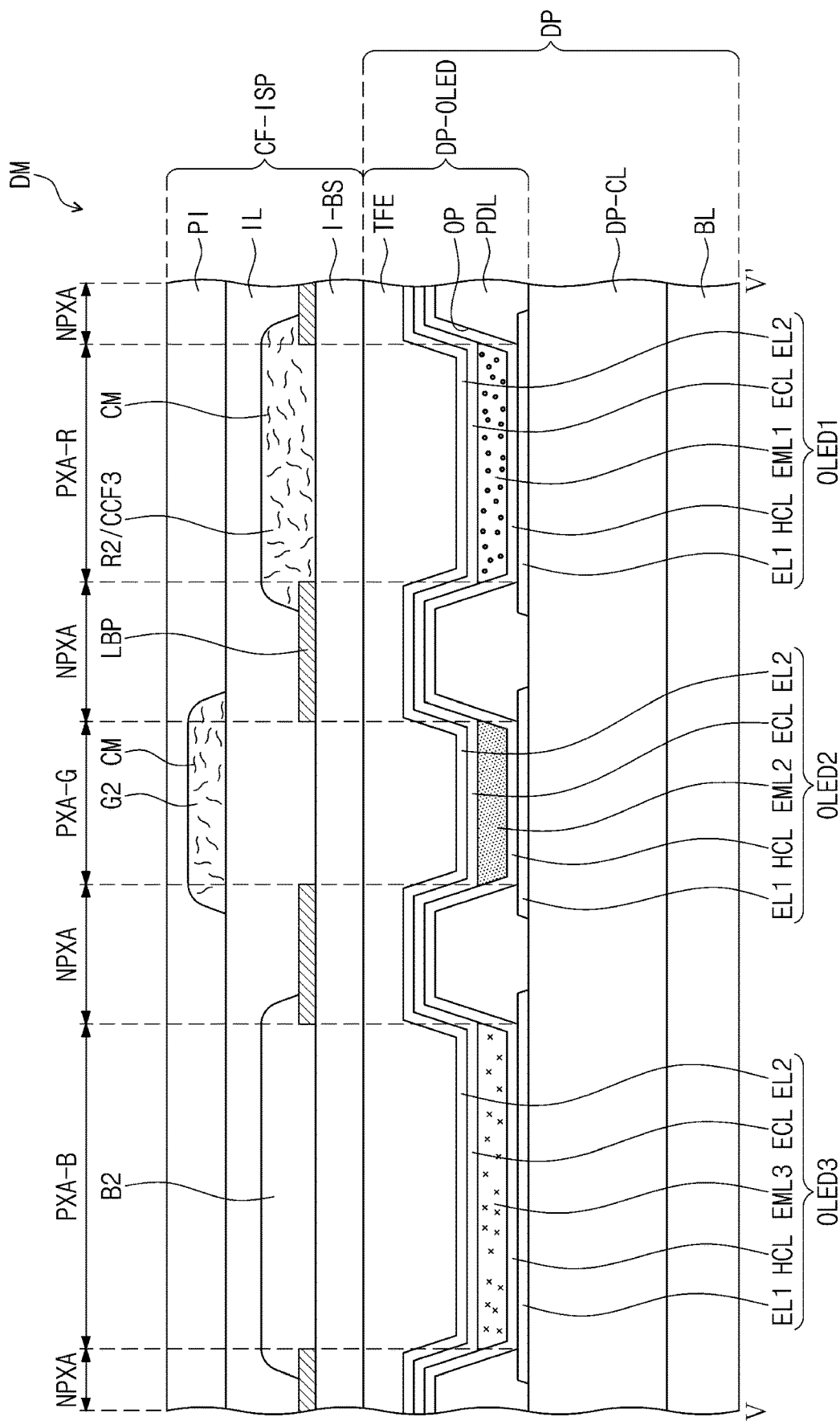
FIG. 8A is a cross-sectional view showing a display module taken along a line V-V' shown in FIG. 7 according to an exemplary embodiment of the present disclosure.

FIG. 7 is an enlarged plan view showing an input sensing unit corresponding to an area BB shown in FIG. 4 according to an exemplary embodiment of the present disclosure. FIG. 8A is a cross-sectional view showing a display module DM taken along a line V-V' shown in FIG. 7 according to an exemplary embodiment of the present disclosure, FIG. 8B is a cross-sectional view showing a display module DM taken along a line VI-VI' shown in FIG. 7 according to an exemplary embodiment of the present disclosure, and FIG. 8C is a cross-sectional view showing the input sensing unit taken along a line IV-IV' shown in FIG. 4 according to an exemplary embodiment of the present disclosure. In FIGS. 7 and 8A to 8C, the same reference numerals denote the same elements shown in FIGS. 5A, 5B, and 6A to 6C, and thus, duplicative descriptions of the same elements will not be repeated.

Referring to FIG. 7, a first conductive color filter CCF1 of an input sensing unit CF-ISP may be in a first sensing area SA1, and a second conductive color filter CCF2 of the input sensing unit CF-ISP may be in a second sensing area SA2. The first conductive color filter CCF1 may include first green color filters G1. For example, the first green color filters G1 in the first sensing area SA1 may be electrically coupled to each other to form a first sensing electrode 1E1. The second conductive color filter CCF2 may include second green color filters G2. In some embodiments, the second green color filters G2 in the second sensing area SA2 may be electrically coupled to each other to form a second sensing electrode 1E2.

The first and second green color filters G1 and G2 may include a conductive material CM (e.g., an electrically conductive material CM). The conductive material CM may include a carbon nanotube and/or a silver nanowire (AgNW), however, the conductive material CM according to the present disclosure should not be limited thereto or thereby and may include another conductive material rather than or in addition to the above-mentioned materials.

The first and second green color filters G1 and G2 may correspond to a second light emitting area PXA-G (refer to FIG. 8A).

The input sensing unit CF-ISP may further include a third conductive color filter CCF3 having a conductivity. The third conductive color filter CCF3 may be electrically conductive. The third conductive color filter CCF3 may include red color filters R. The red color filters R may include the conductive material CM. The red color filters R may be electrically insulated from the first and second green color filters G1 and G2. The red color filters R may correspond to first light emitting areas PXA-R (refer to FIG. 8A).

The input sensing unit CF-ISP may further include a plurality of non-conductive color filters NCF having an insulating property. The plurality of non-conductive color filters NCF may be electrically insulating (e.g., dielectric). As an example, the non-conductive color filters NCF may include blue color filters B. The blue color filters B may not include the conductive material CM and may have an insulating property. The blue color filters B may be electrically insulating (e.g., dielectric). The blue color filters B may correspond to third light emitting areas PXA-B (refer to FIG. 8A).

Referring to FIGS. 7 and 8A, a light blocking pattern LBP may be on a base layer I-BS. The light blocking pattern LBP may overlap a pixel definition layer PDL. The light blocking pattern LBP may not overlap a pixel opening OP defined through the pixel definition layer PDL, and thus, the light blocking pattern LBP may not overlap the light emitting areas PXA-G, PXA-R, and PXA-B. When viewed in a plane (e.g., in a plan view), an area in which the light blocking pattern LBP is located may be defined as a non-light-emitting area NPXA.

The red color filters R and the blue color filters B may be on the base layer I-BS. The red and blue color filters R and B may respectively correspond to the first and third light emitting areas PXA-R and PXA-B. In this case, the red color filters R may have a conductivity, and the blue color filters B do not have the conductivity. For example, the red color filters R may be electrically conductive, and the blue color filters B may be electrically insulating (e.g., dielectric).

The light blocking pattern LBP may partially overlap the red and blue color filters R and B in the non-light-emitting area NPXA. For example, the light blocking pattern LBP may be partially covered by the red and blue color filters R and B extending in the non-light-emitting area NPXA.

The input sensing unit CF-ISP may further include an insulating layer IL that covers the light blocking pattern LBP, the red color filters R, and the blue color filters B. The insulating layer IL may be an inorganic layer or an organic layer. As an example, the insulating layer IL may be a planarization layer to reduce a step difference between the color filters R and B and the light blocking pattern LBP.

The first and second green color filters G1 and G2 may be on the insulating layer IL. In embodiments of the present disclosure, the first green color filters G1 may be in the first sensing area SA1 to form the first sensing electrode IE1, and the second green color filters G2 may be in the second sensing area SA2 to form the second sensing electrode IE2. The first and second green color filters G1 and G2 may have the conductivity. The first green color filter G1 and the second green color filter G2 may be electrically conductive. The first and second green color filters G1 and G2 may include the same (e.g., substantially the same) material and may be concurrently (e.g., substantially simultaneously) formed on the insulating layer IL. For the convenience of explanation, FIG. 8A shows only the second green color filter G2.

The second green color filter G2 may overlap the light blocking pattern LBP in the non-light-emitting area NPXA when viewed in the plane (e.g., in a plan view).

Referring to FIGS. 7 and 8B, at least one first green color filter G1 of the first sensing electrode IE1 may be electrically coupled to at least one first green color filter G1 of an adjacent first sensing electrode IE1 by a first connection pattern CP1. The first connection pattern CP1 may include the same (e.g., substantially the same) material as the first green color filter G1 and may be concurrently (e.g., substantially simultaneously) formed with the first green color filter G1 on the insulating layer IL.

The first connection pattern CP1 may couple two first green color filters G1 to each other in the non-light-emitting area NPXA. The first connection pattern CP1 may overlap the light blocking pattern LBP in the non-light-emitting area NPXA.

At least one second green color filter G2 of the second sensing electrode IE2 may be electrically coupled to at least one second green color filter G2 of an adjacent second sensing electrode IE2 by a second connection pattern CP2. FIG. 7 shows a structure in which two second sensing electrodes IE2 adjacent to each other are coupled to each other by two second connection patterns CP2, however, the present disclosure should not be limited thereto or thereby. For example, the second sensing electrodes IE2 may be coupled to each other by one second connection pattern CP2. In the structure including the two second connection patterns CP2, the two second connection patterns CP2 may have the same (e.g., substantially the same) structure as each other.

The second connection pattern CP2 may include the same (e.g., substantially the same) material as the red color filters R. The second connection pattern CP2 may be concurrently (e.g., substantially simultaneously) formed with the red color filters R on the base layer I-BS.

The second connection pattern CP2 may be on the light blocking pattern LBP in the non-light-emitting area NPXA. The second connection pattern CP2 may couple two second green color filters G2 to each other. Both ends of the second connection pattern CP2 may make contact directly with the second green color filters G2, respectively.

A first contact hole CNT1 that exposes one end of the second connection pattern CP2 and a second contact hole CNT2 that exposes the other end of the second connection pattern CP2 may be defined through the insulating layer IL. One second green color filter of the two second green color filters G2 may make contact directly with the one end of the second connection pattern CP2 through the first contact hole CNT1, and the other second green color filter of the two second green color filters G2 may make contact directly with the other end of the second connection pattern CP2 through the second contact hole CNT2.

Referring to FIGS. 4, 7, and 8C, first signal lines SL1-1 to SL1-5 may include the same (e.g., substantially the same) material as the first green color filters G1, and second signal lines SL2-1 to SL2-4 may include the same (e.g., substantially the same) material as the second green color filters G2. In the present exemplary embodiment, because the first and second green color filters G1 and G2 include the same (e.g., substantially the same) material as each other, the first signal lines SL1-1 to SL1-5 and second signal lines SL2-1 to SL2-4 may be formed of the same (e.g., substantially the same) material.

As described above, when the first and second sensing electrodes IE1 and IE2 are formed by the conductive color filters CCF1 and CCF2, an overall thickness of the display module DM may be reduced. In addition, because the first and second sensing electrodes IE1 and IE2 are formed in the light emitting areas PXA-R and PXA G, the area in which the first and second sensing electrodes IE1 and IE2 are formed may increase, and as a result, the sensing sensitivity of the input sensing unit CF-ISP may be improved when sensing the external input.

The display module DM shown in FIGS. 7 and 8A to 8C may further include the insulating layer as compared with the display module DM shown in FIGS. 5A, 5B, and 6A to 6C, and a mask process may be added to form the first and second contact holes through the insulating layer. However, as the conductive color filters CCF1 and CCF2 are used as the first and second sensing electrodes IE1 and IE2, the number of total masks needed to form the input sensing unit CF-ISP may be reduced, and as a result, the manufacturing process of the display module DM may be simplified.

Figure 9A:
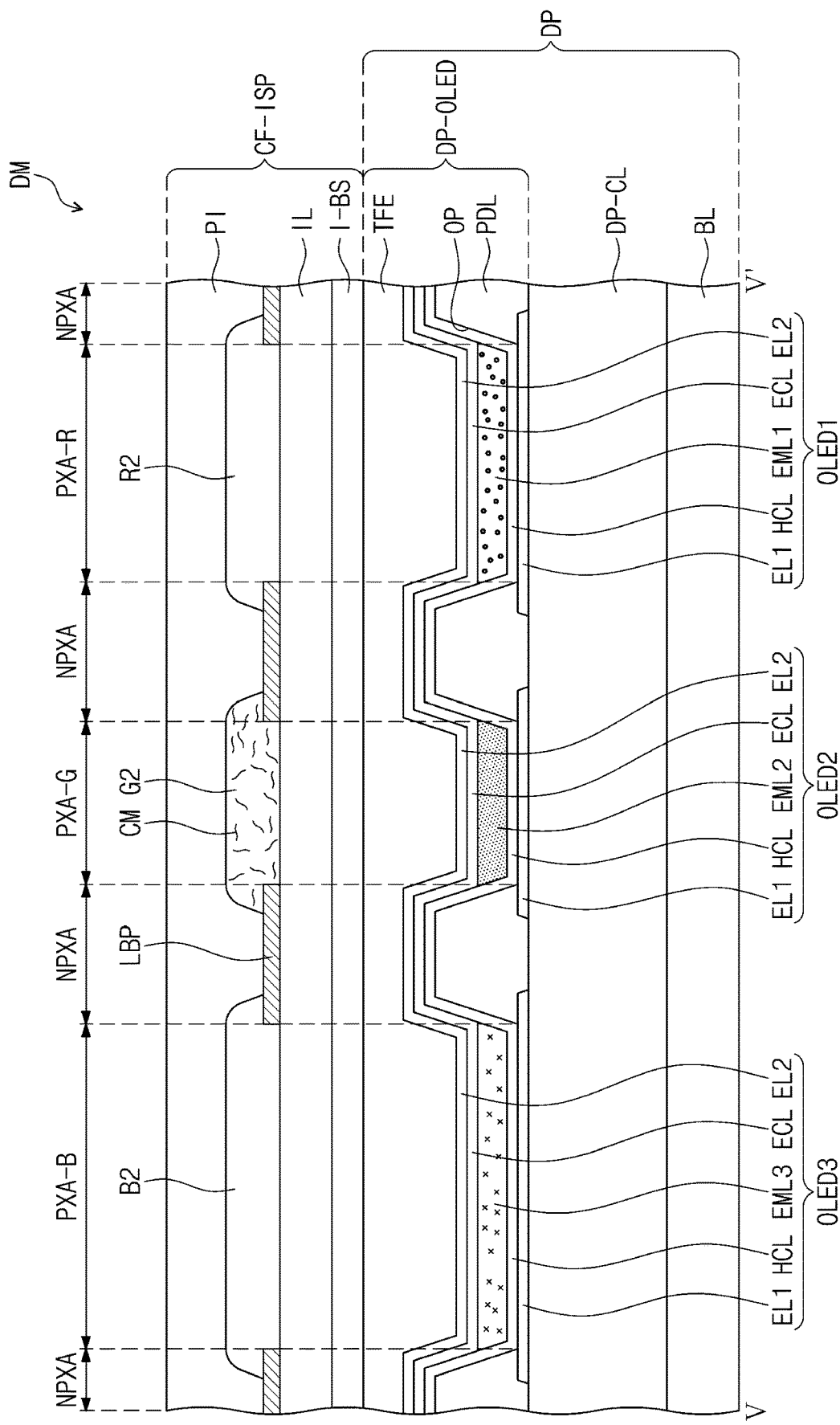
FIG. 9A is a cross-sectional view showing a display module taken along a line V-V' shown in FIG. 7 according to an exemplary embodiment of the present disclosure.
Figure 9B:
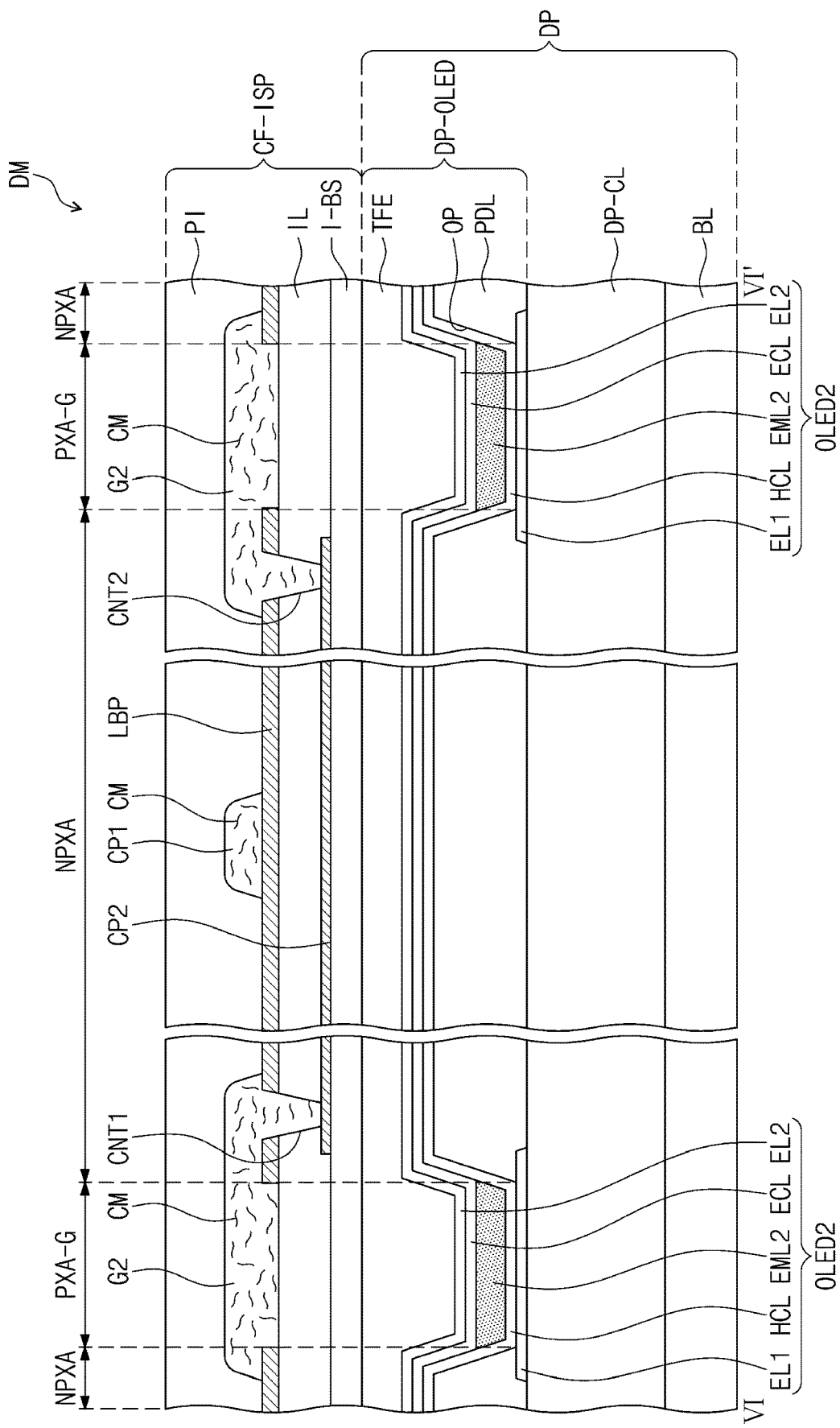
FIG. 9B is a cross-sectional view showing a display module taken along a line VI-VI' shown in FIG. 7 according to an exemplary embodiment of the present disclosure.
Figure 9C:
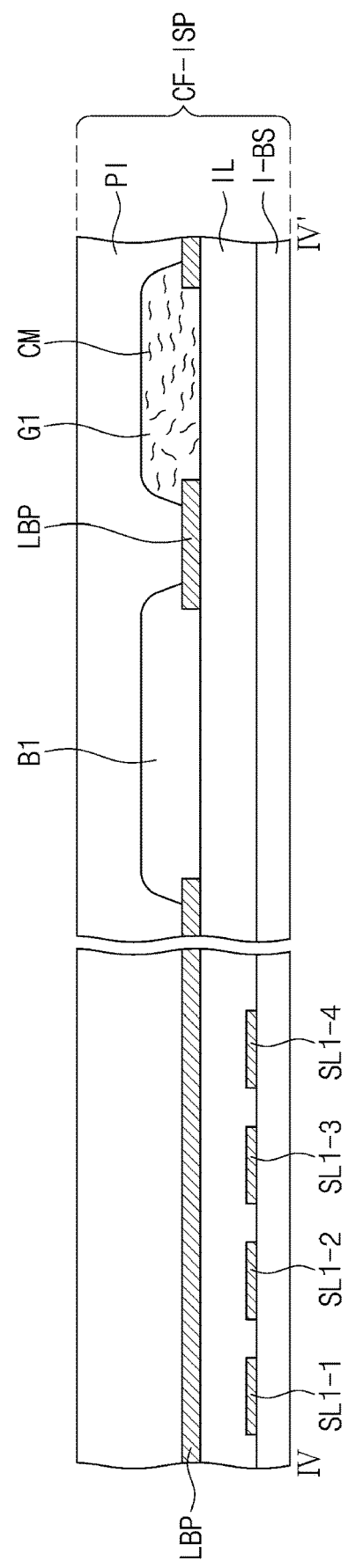
FIG. 9C is a cross-sectional view showing an input sensing unit taken along a line IV-IV' shown in FIG. 4 according to an exemplary embodiment of the present disclosure.

FIG. 9A is a cross-sectional view showing a display module taken along a line V-V' shown in FIG. 7 according to an exemplary embodiment of the present disclosure, FIG. 9B is a cross-sectional view showing a display module taken along a line VI-VI' shown in FIG. 7 according to an exemplary embodiment of the present disclosure, and FIG. 9C is a cross-sectional view showing an input sensing unit taken along a line IV-IV' shown in FIG. 4 according to an exemplary embodiment of the present disclosure. In FIGS. 9A to 9C, the same reference numerals denote the same elements in FIGS. 8A to 8C, and thus, duplicative descriptions of the same elements will not be repeated.

Referring to FIGS. 7, 9A, and 9B, a second connection pattern CP2 may be on a base layer I-BS. The second connection pattern CP2 may include a transparent conductive material or a metal conductive material. The transparent conductive material may include at least one selected from indium tin oxide (ITO), indium zinc oxide (IZO), zinc oxide (ZnO), indium tin zinc oxide (ITZO), PEDOT, a metal nanowire, and a graphene. The metal conductive material may include molybdenum, silver, titanium, copper, aluminum, and/or alloys thereof.

The second connection pattern CP2 may be covered by an insulating layer IL. The insulating layer IL may include an inorganic layer and/or an organic layer. As an example, the insulating layer IL may include silicon nitride and/or silicon oxide.

A light blocking pattern LBP may be on the insulating layer IL. The light blocking pattern LBP may not overlap light emitting areas PXA-G, PXA-R, and PXA-B. When viewed in the plane (e.g., in a plan view), an area in which the light blocking pattern LBP is located may be defined as a non-pixel area NPXA.

The second connection pattern CP2 may be in a non-light-emitting area NPXA and may overlap the light blocking pattern LBP when viewed in the plane (e.g., in a plan view).

Color filters G1, G2, R, and B may be on the insulating layer IL. The color filters G1, G2, R, and B may include a first conductive color filter CCF1 in a first sensing area SA1 and a second conductive color filter CCF2 in a second sensing area SA2. In FIG. 7, the first conductive color filter CCF1 may include the first green color filters G1, and the second conductive color filter CCF2 may include the second green color filters G2. The first and second green color filters G1 and G2 may include a conductive material (e.g., an electrically conductive material). The first green color filters G1 in the first sensing area SA1 may be electrically coupled to each other to form a first sensing electrode 1E1. The second green color filters G2 in the second sensing area SA2 may be electrically coupled to each other to form a second sensing electrode 1E2. The first and second green color filters G1 and G2 may correspond to a second light emitting areas PXA-G.

The color filters G1, G2, R, and B may further include a non-conductive color filter NCF. The non-conductive color filter NCF may be electrically insulating (e.g., dielectric). The non-conductive color filter NCF may include red color filters R and blue color filters B. Each of the red and blue color filters R and B may correspond to each of first and third light emitting areas PXA-R and PXA-B. In this case, the red and blue color filters R and B do not have conductivity (e.g., are not electrically conductive).

Referring to FIGS. 7 and 9B, at least one first green color filter G1 of the first sensing electrode IE1 may be electrically coupled to at least one first green color filter G1 of an adjacent first sensing electrode IE1 by a first connection pattern CP1. The first connection pattern CP1 may include the same (e.g., substantially the same) material as the first green color filter G1 and may be concurrently (e.g., substantially simultaneously) formed with the first green color filter G1 on the insulating layer IL.

The first connection pattern CP1 may couple the two first green color filters G1 to each other in the non-light-emitting area NPXA. The first connection pattern CP1 may overlap the light blocking pattern LBP in the non-light-emitting area NPXA.

At least one second green color filter G2 of the second sensing electrode IE2 may be electrically coupled to at least one second green color filter G2 of an adjacent second sensing electrode IE2 by the second connection pattern CP2.

The second connection pattern CP2 may couple the two second green color filters G2 to each other. Both ends of the second connection pattern CP2 may make contact directly with the second green color filters G2, respectively.

A first contact hole CNT1 that exposes one end of the second connection pattern CP2 and a second contact hole CNT2 that exposes the other end of the second connection pattern CP2 may be defined through the insulating layer IL. One second green color filter of the two second green color filters G2 may make contact directly with the one end of the second connection pattern CP2 through the first contact hole CNT1, and the other second green color filter of the two second green color filters G2 may make contact directly with the other end of the second connection pattern CP2 through the second contact hole CNT2.

Referring to FIGS. 4, 7, and 9C, first signal lines SL1-1 to SL1-5 and second signal lines SL2-1 to SL2-4 may include the same (e.g., substantially the same) material as the second connection pattern CP2. For example, the first signal lines SL1-1 to SL1-5 and the second signal lines SL2-1 to SL2-4 may include the transparent conductive material or the metal conductive material. The transparent conductive material may include at least one selected from indium tin oxide (ITO), indium zinc oxide (IZO), zinc oxide (ZnO), indium tin zinc oxide (ITZO), PEDOT, a metal nanowire, and a graphene. The metal conductive material may include molybdenum, silver, titanium, copper, aluminum, and/or alloys thereof.

The first signal lines SL1-1 to SL1-5 and the second signal lines SL2-1 to SL2-4 may be covered by the insulating layer IL and may overlap the light blocking pattern LBP on the insulating layer IL when viewed in the plane (e.g., in a plan view).

As described above, when the first and second sensing electrodes IE1 and IE2 are formed by the conductive color filters CCF1 and CCF2, an overall thickness of the display module DM may be reduced. In addition, because the first and second sensing electrodes IE1 and IE2 are formed in the light emitting areas PXA-R and PXA G, the area in which the first and second sensing electrodes 1E1 and 1E2 are formed may increase, and as a result, the sensing sensitivity of input sensing unit CF-ISP may be improved when sensing the external input.

Figure 10:
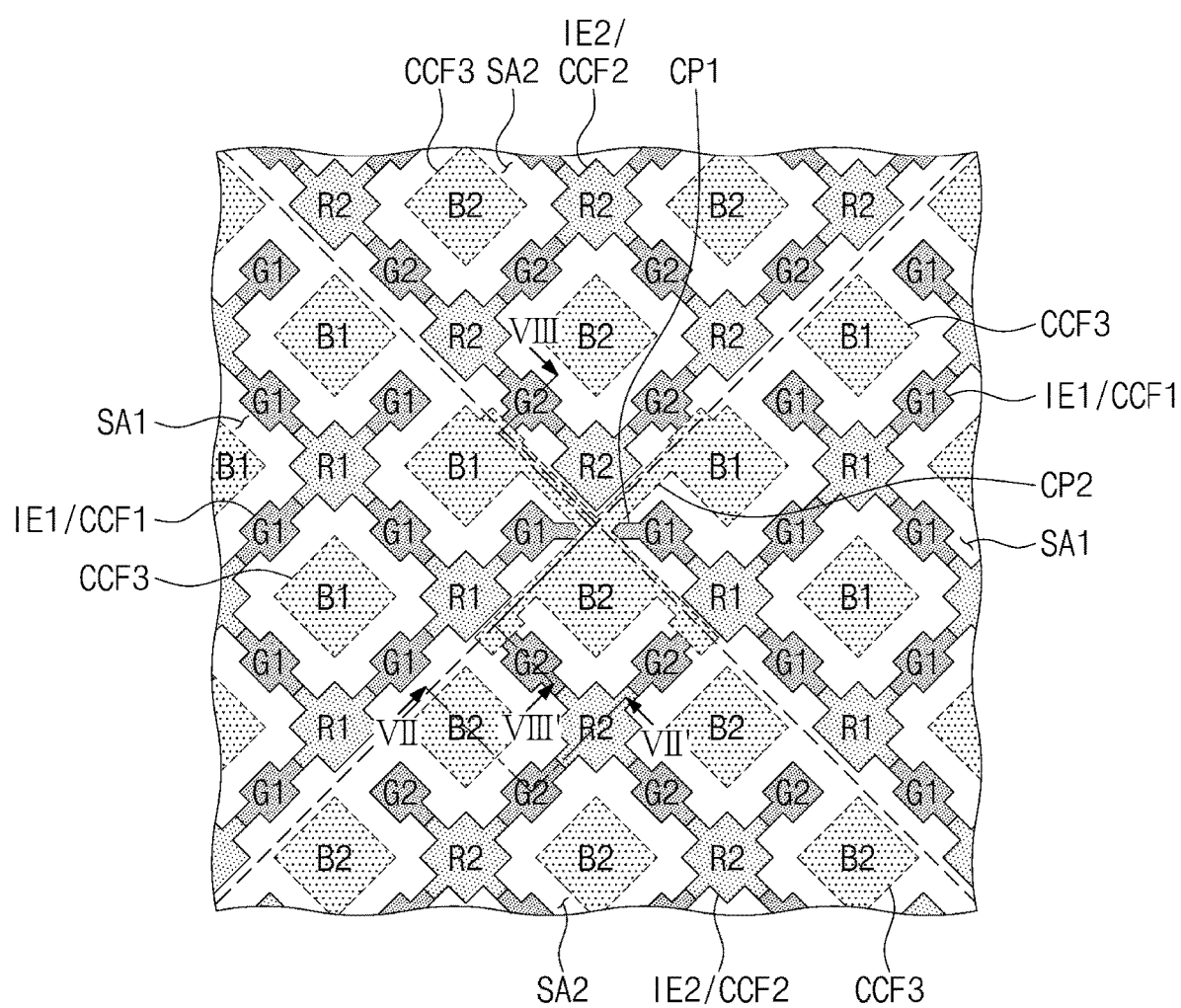
FIG. 10 is an enlarged plan view showing an input sensing unit corresponding to an area BB shown in FIG. 4 according to an exemplary embodiment of the present disclosure.
Figure 11A:
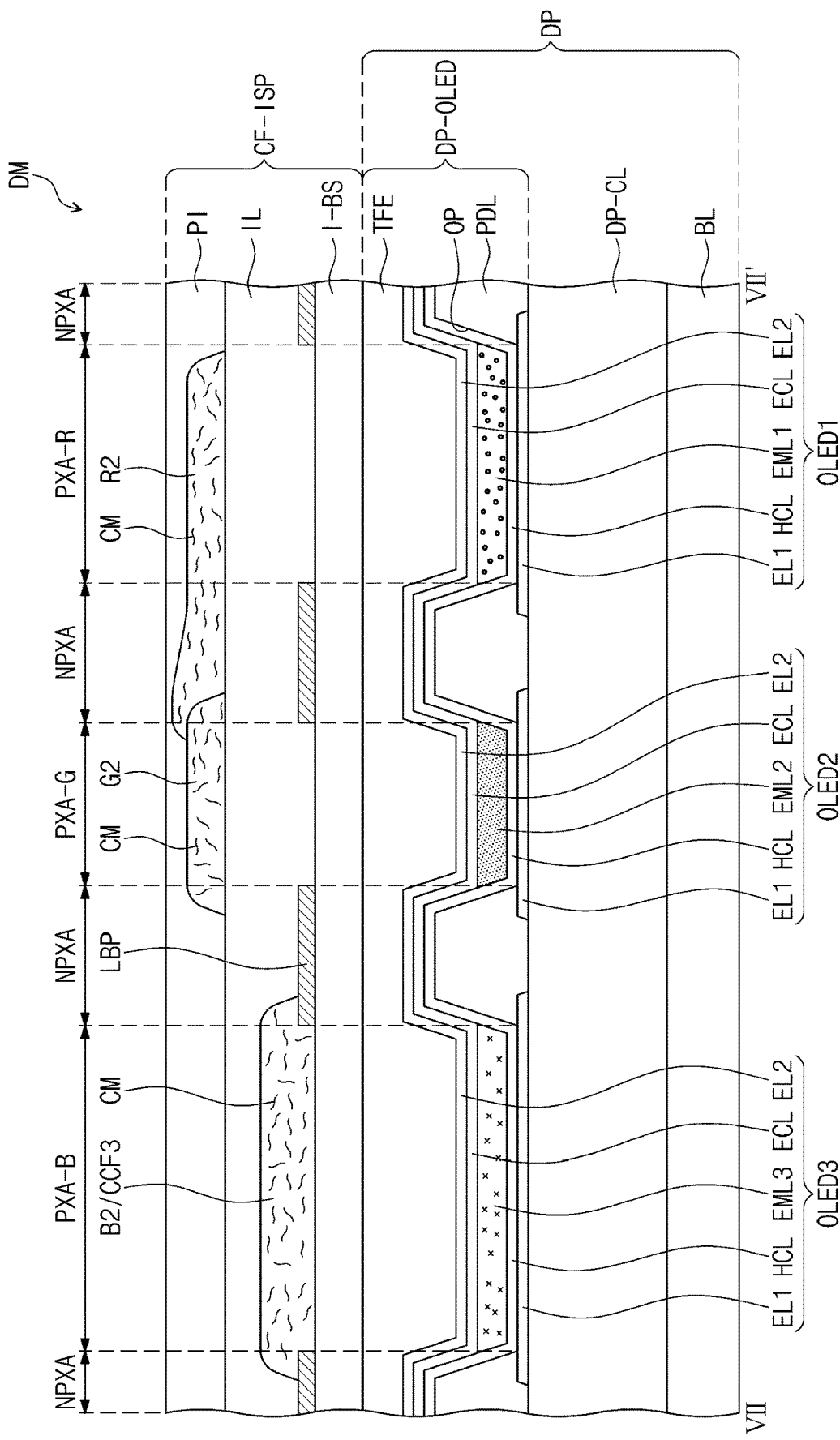
FIG. 11A is a cross-sectional view showing a display module taken along a line VII-VII' shown in FIG. 10 according to an exemplary embodiment of the present disclosure.
Figure 11B:
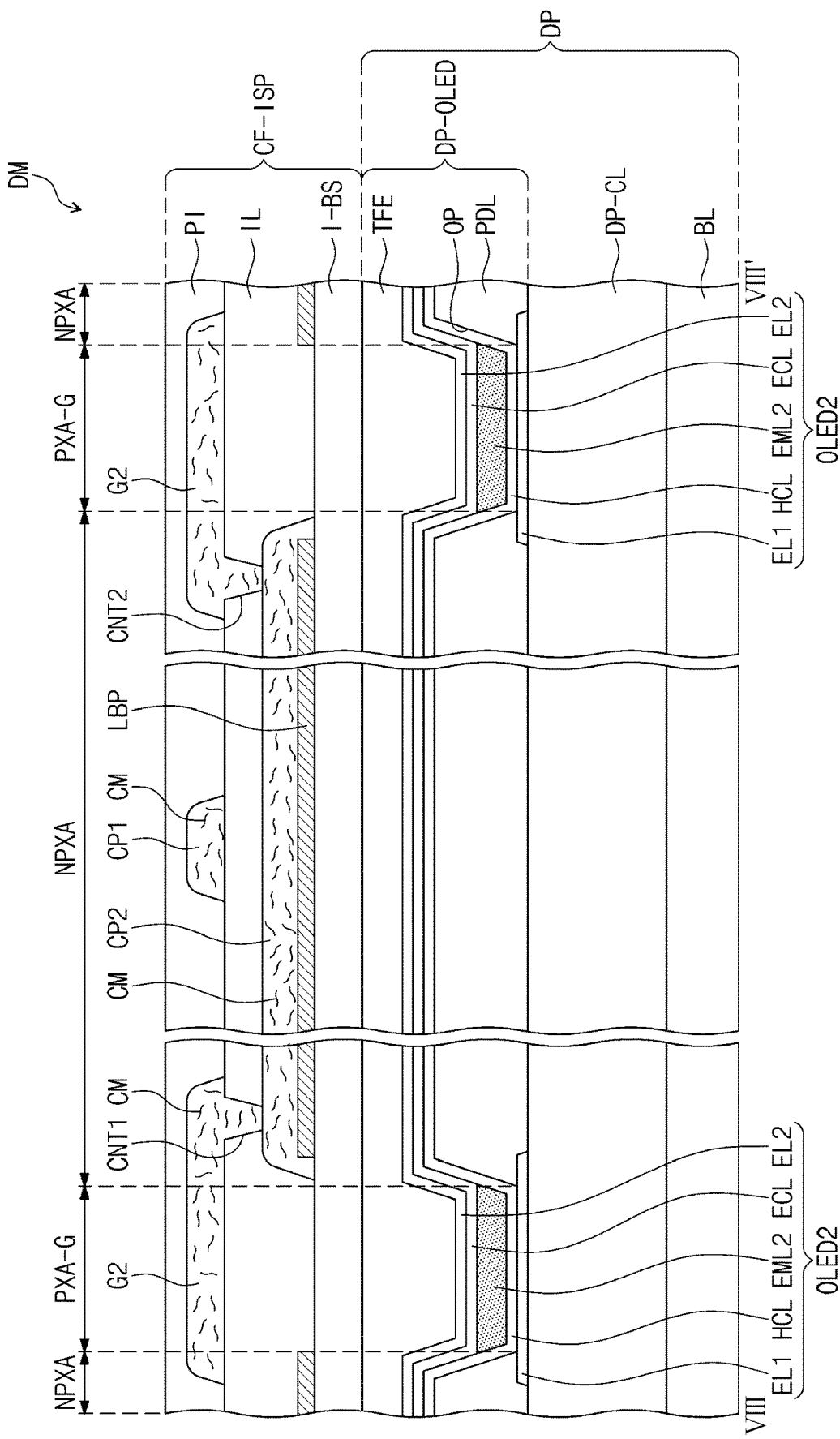
FIG. 11B is a cross-sectional view showing a display module taken along a line VIII-VIII' shown in FIG. 10 according to an exemplary embodiment of the present disclosure.

FIG. 10 is an enlarged plan view showing an input sensing unit corresponding to an area BB shown in FIG. 4 according to an exemplary embodiment of the present disclosure. FIG. 11A is a cross-sectional view showing a display module taken along a line VII-VII' shown in FIG. 10 according to an exemplary embodiment of the present disclosure, and FIG. 11B is a cross-sectional view showing a display module taken along a line VIII-VIII' shown in FIG. 10 according to an exemplary embodiment of the present disclosure.

Referring to FIG. 10, a first conductive color filter CCF1 of the input sensing unit CF-ISP may be in a first sensing area SA1, and a second conductive color filter CCF2 of the input sensing unit CF-ISP may be in a second sensing area SA2. The first conductive color filter CCF1 may include first green color filters G1 and first red color filters R1. The first green color filters G1 may be electrically coupled to the first red color filters R1 to form a first sensing electrode 1E1. The second conductive color filter CCF2 may include second green color filters G2 and second red color filters R2. The second green color filters G2 may be electrically coupled to the second red color filters R2 to form a second sensing electrode 1E2.

The input sensing unit CF-ISP may further include a third conductive color filter CCF3. The third conductive color filter CCF3 may include blue color filters B1 and B2.

Referring to FIGS. 10 and 11A, a light blocking pattern LBP may be on a base layer I-BS. The light blocking pattern LBP may not overlap the light emitting areas PXA-G, PXA-R, and PXA-B. When viewed in a plane (e.g., in a plan view), the area in which the light blocking pattern LBP is located may be defined as a non-light-emitting area NPXA.

The blue color filters B1 and B2 may be on the base layer I-BS. The blue color filters B1 and B2 may correspond to the third light emitting areas PXA-B. The blue color filters B1 and B2 may include a conductive material CM (e.g., an electrically conductive material CM) and may have a conductivity (e.g., may be electrically conductive).

The light blocking pattern LBP may partially overlap the blue color filters B1 and B2 in the non-light-emitting area NPXA. The light blocking pattern LBP may be partially covered by the blue color filters B1 and B2 extending in the non-light-emitting area NPXA.

The input sensing unit CF-ISP may further include an insulating layer IL that covers the light blocking pattern LBP and the blue color filters B1 and B2. The insulating layer IL may include an inorganic layer and/or an organic layer. As an example, the insulating layer IL may be a planarization layer to reduce a step difference between the blue color filters B1 and B2 and the light blocking pattern LBP.

The first and second conductive color filters CCF1 and CCF2 may be on the insulating layer IL. The first conductive color filter CCF1 may include the first green color filter G1 and the first red color filter R1, and the second conductive color filter CCF2 may include the second green color filter G2 and the second red color filter R2.

For the convenience of explanation, FIG. 11A shows only the second green color filter G2 and the second red color filter R2. In the present exemplary embodiment, the second green and red color filters G2 and R2 may include a conductive material CM. The conductive material CM may include a carbon nanotube and/or a silver nanowire (AgNW). The second red color filter R2 and the second green color filter G2 may correspond to the first and second light emitting areas PXA-R and PXA-G.

The second green color filter G2 may overlap the light blocking pattern LBP in the non-light-emitting area NPXA when viewed in the plane (e.g., in a plan view), and the second red color filter R2 may overlap the light blocking pattern LBP in the non-light-emitting area NPXA when viewed in the plane (e.g., in a plan view). The second green and red color filters G2 and R2 may make contact directly with each other and overlap each other in the non-light-emitting area NPXA.

Referring to FIGS. 10 and 11B, at least one first green color filter G1 of the first sensing electrode IE1 may be electrically coupled to at least one first green color filter G1 of an adjacent first sensing electrode IE1 by a first connection pattern CP1.

The first connection pattern CP1 may include the same (e.g., substantially the same) material as the first green color filter G1 and may be concurrently (e.g., substantially simultaneously) formed with the first green color filter G1 on the insulating layer IL.

The first connection pattern CP1 may couple the two first green color filters G1 to each other in the non-light-emitting area NPXA. The first connection pattern CP1 may overlap the light blocking pattern LBP in the non-light-emitting area NPXA.

At least one second green color filter G2 of the second sensing electrode IE2 may be electrically coupled to at least one second green color filter G2 of an adjacent second sensing electrode IE2 by a second connection pattern CP2. The second connection pattern CP2 may include the same (e.g., substantially the same) material as the blue color filters B1 and B2. The second connection pattern CP2 may be concurrently (e.g., substantially simultaneously) formed with the blue color filters B1 and B2 on the base layer I-BS.

The second connection pattern CP2 may be on the light blocking pattern LBP in the non-light-emitting area NPXA. The second connection pattern CP2 may couple the two second green color filters G2 to each other. Both ends of the second connection pattern CP2 may make contact directly with the second green color filters G2, respectively.

A first contact hole CNT1 that exposes one end of the second connection pattern CP2 and a second contact hole CNT2 that exposes the other end of the second connection pattern CP2 may be defined through the insulating layer IL. One second green color filter of the two second green color filters G2 may make contact directly with the one end of the second connection pattern CP2 through the first contact hole CNT1, and the other second green color filter of the two second green color filters G2 may make contact directly with the other end of the second connection pattern CP2 through the second contact hole CNT2.

In some embodiments, first signal lines SL1-1 to SL1-5 and second signal lines SL2-1 to SL2-4 may include the same (e.g., substantially the same) material as one of the first and second connection patterns CP1 and CP2.

Although exemplary embodiments of the present disclosure have been described, it is understood that the subject matter of the present disclosure should not be limited to these exemplary embodiments but various changes and modifications can be made by one ordinary skilled in the art within the spirit and scope of the present disclosure as hereinafter claimed.

Therefore, the disclosed subject matter should not be limited to any single embodiment described herein, and the scope of the present disclosure concept shall be determined according to the appended claims, and equivalents thereof.

What is claimed is:

1. A display device comprising:
    a display panel comprising a plurality of pixels; and
    an input sensing unit comprising a plurality of color filters that correspond with the pixels, the color filters comprising a plurality of conductive color filters that are electrically conductive, the conductive color filters comprising first conductive color filters in first sensing areas arranged in a first direction and second conductive color filters in second sensing areas arranged in a second direction, and the input sensing unit further comprising:
    a first connection pattern electrically coupling the first conductive color filters; and
    a second connection pattern electrically coupling the second conductive color filters,
    wherein the color filters further comprise a plurality of non-conductive color filters that are electrically insulating.

2. The display device of claim 1, wherein the first conductive color filters comprise:
    a first green color filter; and
    a first red color filter electrically coupled to the first green color filter, and the second conductive color filters comprise:
    a second green color filter; and
    a second red color filter electrically coupled to the second green color filter.

3. The display device of claim 2, wherein the non-conductive color filters comprise a blue color filter.

4. The display device of claim 2, wherein the first connection pattern comprises a same material as one selected from the first green color filter and the first red color filter, and the second connection pattern comprises:
    an insulating pattern comprising a same material as the non-conductive color filter; and
    a conductive pattern comprising a same material as one selected from the second green color filter and the second red color filter and on the insulating pattern to electrically couple the second conductive color filters.

5. The display device of claim 4, wherein the conductive pattern is electrically insulated from the first conductive color filters by the insulating pattern.

6. The display device of claim 4, wherein the conductive pattern comprises a same material as the second red color filter and is electrically coupled to the second green color filter.

7. The display device of claim 4, wherein the non-conductive color filters comprise a blue color filter, and the insulating pattern comprises a same material as the blue color filter.

8. The display device of claim 1, wherein the input sensing unit further comprises:
    a base layer provided with the conductive color filters and the non-conductive color filters on an upper surface thereof; and
    a light blocking pattern between the conductive color filters, between the non-conductive color filters, and between the conductive color filters and the non-conductive color filters.

9. The display device of claim 1, wherein the input sensing unit further comprises:
    an insulating layer on which the first and second conductive color filters are located; and
    a base layer on which the non-conductive color filters are located, and the insulating layer covers the non-conductive color filters.

10. The display device of claim 9, wherein the input sensing unit further comprises a third conductive color filter on the base layer, and
    wherein the third conductive color filter is covered by the insulating layer and is electrically conductive.

11. The display device of claim 10, wherein the first conductive color filters comprise a first green color filter, the second conductive color filters comprise a second green color filter, and the third conductive color filter comprises one selected from a blue color filter and a red color filter.

12. The display device of claim 11, wherein the first connection pattern comprises a same material as the first green color filter and is on the insulating layer, the second connection pattern comprises a same material as the third conductive color filter and is on the base layer, the insulating layer is provided with a contact hole defined therethrough, and the second connection pattern makes contact with the second conductive color filters through the contact hole.

13. The display device of claim 9, wherein the input sensing unit further comprises a light blocking pattern on the base layer and between the first and second conductive color filters, between the non-conductive color filters, and between the first and second conductive color filters and the non-conductive color filters.

14. A display device comprising:
a display panel comprising a plurality of pixels; and
an input sensing unit comprising a plurality of color filters that correspond with the pixels, the color filters comprising a plurality of conductive color filters that are electrically conductive, the conductive color filters comprising first conductive color filters in first sensing areas arranged in a first direction and second conductive color filters in second sensing areas arranged in a second direction, and the input sensing unit further comprising:
a first connection pattern electrically coupling the first conductive color filters; and
a second connection pattern electrically coupling the second conductive color filters,
wherein the input sensing unit further comprises:
a base layer;
a third conductive color filter that is electrically conductive and on the base layer; and
an insulating layer covering the third conductive color filter, and the first and second conductive color filters are on the insulating layer.

15. The display device of claim 14, wherein the first conductive color filters comprise:
a first green color filter; and
a first red color filter electrically coupled to the first green color filter, the second conductive color filters comprising:
a second green color filter; and
a second red color filter electrically coupled to the second green color filter, and wherein the third conductive color filter comprises a blue color filter.

16. The display device of claim 15, wherein the second connection pattern comprises a same material as the third conductive color filter and is on the base layer, the insulating layer is provided with a contact hole defined therethrough, and the second connection pattern makes contact with the second conductive color filters through the contact hole.

17. The display device of claim 15, wherein the input sensing unit further comprises a light blocking pattern on the base layer and between the first and second conductive color filters, between non-conductive color filters, and between the first and second conductive color filters and the non-conductive color filters.

18. A display device comprising:
a display panel comprising a plurality of pixels; and
an input sensing unit comprising a plurality of color filters that correspond with the pixels, the color filters comprising a plurality of conductive color filters that are electrically conductive, the conductive color filters comprising first conductive color filters in first sensing areas arranged in a first direction and second conductive color filters in second sensing areas arranged in a second direction, and the input sensing unit further comprising:
a first connection pattern electrically coupling the first conductive color filters; and
a second connection pattern electrically coupling the second conductive color filters,
wherein the input sensing unit further comprises:
a base layer provided with the second connection pattern on an upper surface thereof; and
an insulating layer covering the second connection pattern,
wherein the conductive color filters and the first connection pattern are on the insulating layer.

19. The display device of claim 18, wherein each of the conductive color filters comprises at least one color filter selected from among red, green, and blue color filters,
the first connection pattern comprises a same material as the at least one color filter included in the first conductive color filter, and the second connection pattern comprises a transparent conductive material or a metal conductive material.

* * * * *